United States Patent
Yun et al.

(10) Patent No.: US 11,978,748 B2
(45) Date of Patent: May 7, 2024

(54) IMAGE SENSOR INCLUDING COLOR SEPARATING LENS ARRAY, INCLUDING REGIONS OF DIFFERENT PATTERNS, AND ELECTRONIC APPARATUS INCLUDING THE IMAGE SENSOR

(71) Applicant: SAMSUNG ELECTRONICS CO., LTD., Suwon-si (KR)

(72) Inventors: Seokho Yun, Hwaseong-si (KR); Sookyoung Roh, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 288 days.

(21) Appl. No.: 17/078,670

(22) Filed: Oct. 23, 2020

(65) Prior Publication Data

US 2021/0126030 A1   Apr. 29, 2021

(30) Foreign Application Priority Data

Oct. 23, 2019 (KR) .................. 10-2019-0132386
Nov. 14, 2019 (KR) .................. 10-2019-0146233
Sep. 10, 2020 (KR) .................. 10-2020-0116388

(51) Int. Cl.
*H01L 27/146* (2006.01)
*G02B 3/00* (2006.01)
(Continued)

(52) U.S. Cl.
CPC ...... *H01L 27/14621* (2013.01); *G02B 3/0056* (2013.01); *G02B 5/1876* (2013.01);
(Continued)

(58) Field of Classification Search
CPC ......... H01L 27/14621; H01L 27/14607; H01L 27/14685; H01L 27/14645; H01L 27/1462;
(Continued)

(56) References Cited

U.S. PATENT DOCUMENTS 7,202,896 B2   4/2007   Wako et al.
7,741,664 B2   6/2010   Choi et al.
(Continued)

FOREIGN PATENT DOCUMENTS

CN   106483594 A   3/2017
EP   2963923 A1   1/2016
(Continued)

OTHER PUBLICATIONS

Chen, Bo Han, et al.,"GaN Metalens for Pixel-Level Full-Color Routing at Visible Light", NANO Letters, American Chemical Society, vol. 17, Sep. 11, 2017, pp. 6345-6352.
(Continued)

*Primary Examiner* — Jennifer D Bennett
*Assistant Examiner* — Erin R Garber
(74) *Attorney, Agent, or Firm* — Sughrue Mion, PLLC

(57) ABSTRACT

Provided is an image sensor including a sensor substrate including a first photo-sensing cell and a second photo-sensing cell configured to sense light, a spacer layer that is transparent and disposed on the sensor substrate, and a color separating lens array disposed on the spacer layer and including a first region disposed opposite to the first photo-sensing cell in a vertical direction and having a first pattern, and a second region disposed opposite to the second photo-sensing cell in the vertical direction and having a second pattern that is different from the first pattern, and wherein the first pattern is configured to separate, from incident light, a first wavelength light and condense the first wavelength light to the first photo-sensing cell, and the second pattern is configured to separate, from the incident light, a second wavelength light and condense the second wavelength light to the second photo-sensing cell.

25 Claims, 65 Drawing Sheets

(51) Int. Cl.
*G02B 5/18* (2006.01)
*H04N 25/70* (2023.01)

(52) U.S. Cl.
CPC .. *H01L 27/14607* (2013.01); *H01L 27/14627* (2013.01); *H04N 25/70* (2023.01); *H01L 27/1462* (2013.01)

(58) Field of Classification Search
CPC ............. H01L 27/14627; H01L 27/322; H01L 31/02162; H01L 27/14667; H04N 5/369; H04N 9/04557; H04N 13/257; H04N 9/0455; G02B 5/1876; G02B 2207/101; G02B 3/0056; G02B 5/201; G02B 2006/12102; G02B 2006/12109; G02F 1/133514; G02F 1/133526; G02F 2203/055
See application file for complete search history.

(56) References Cited

U.S. PATENT DOCUMENTS

| | | | |
|---|---|---|---|
| 8,076,745 B2 | 12/2011 | Nishiwaki | |
| 8,289,422 B2 | 10/2012 | Hiramoto et al. | |
| 8,687,174 B2 | 4/2014 | Fossum et al. | |
| 9,520,423 B2 | 12/2016 | Lee et al. | |
| 9,766,467 B2 | 9/2017 | Sohn | |
| 10,136,109 B2 | 11/2018 | Yun et al. | |
| 10,170,510 B2 | 1/2019 | Park | |
| 10,886,321 B2 | 1/2021 | Miyata et al. | |
| 2006/0125948 A1* | 6/2006 | Orita | H01L 31/02327 348/340 |
| 2006/0284052 A1* | 12/2006 | Toshikiyo | H01L 27/14685 250/208.1 |
| 2008/0011937 A1 | 1/2008 | Toshikiyo | |
| 2008/0173793 A1* | 7/2008 | Mokhnatyuk | G03H 1/0005 348/E9.01 |
| 2009/0115011 A1 | 5/2009 | Ushiro et al. | |
| 2009/0160965 A1 | 6/2009 | Sorek et al. | |
| 2009/0250594 A1 | 10/2009 | Tanaka et al. | |
| 2010/0127156 A1* | 5/2010 | Yokogawa | G02B 5/1809 250/208.1 |
| 2011/0018042 A1 | 1/2011 | Lee et al. | |
| 2012/0206637 A1 | 8/2012 | Hiramoto et al. | |
| 2012/0212656 A1 | 8/2012 | Hiramoto et al. | |
| 2014/0284746 A1* | 9/2014 | Suzuki | H01L 27/14618 257/432 |
| 2016/0260762 A1 | 9/2016 | Ungnapatanin et al. | |
| 2017/0179178 A1 | 6/2017 | Park | |
| 2017/0261368 A1* | 9/2017 | Nam | H01L 27/14603 |
| 2017/0337664 A1 | 11/2017 | Grahn et al. | |
| 2018/0164154 A1 | 6/2018 | Roh et al. | |
| 2020/0021782 A1 | 1/2020 | Sugizaki | |
| 2021/0120168 A1 | 4/2021 | Shim et al. | |
| 2021/0124179 A1 | 4/2021 | Yun et al. | |
| 2021/0126035 A1 | 4/2021 | Roh et al. | |
| 2021/0366964 A1* | 11/2021 | Ito | H01L 27/14621 |

FOREIGN PATENT DOCUMENTS

| | | |
|---|---|---|
| JP | 2007-184560 A | 7/2007 |
| JP | 2019-184986 A | 10/2019 |
| KR | 10-2012-0015257 A | 2/2012 |
| KR | 1020160004641 A | 1/2016 |
| KR | 10-2016-0046370 A | 4/2016 |
| KR | 10-2017-0074572 A | 6/2017 |
| KR | 101772968 B1 | 8/2017 |
| KR | 1020180131175 A | 12/2018 |
| KR | 10-2021-0047738 A | 4/2021 |
| KR | 10-2021-0048399 A | 5/2021 |
| KR | 10-2021-0048400 A | 5/2021 |

OTHER PUBLICATIONS

Nishiwaki, Seiji., et al., "Efficient colour splitters for high-pixel-density image sensors", Nature Photonics, vol. 7, Mar. 2013, pp. 240-246.
Communication dated Mar. 25, 2021, issued by the European Patent Office in European Application No. 20202814.8.
Communication dated Mar. 25, 2021, issued by the European Patent Office in European Application No. 20202827.0.
Communication dated Mar. 29, 2021, issued by the European Patent Office in European Application No. 20202807.2.

* cited by examiner

| R | G | R |
|---|---|---|
| G | B | G |
| R | G | R |

FIG. 11B

| B | G | B |
|---|---|---|
| G | R | G |
| B | G | B |

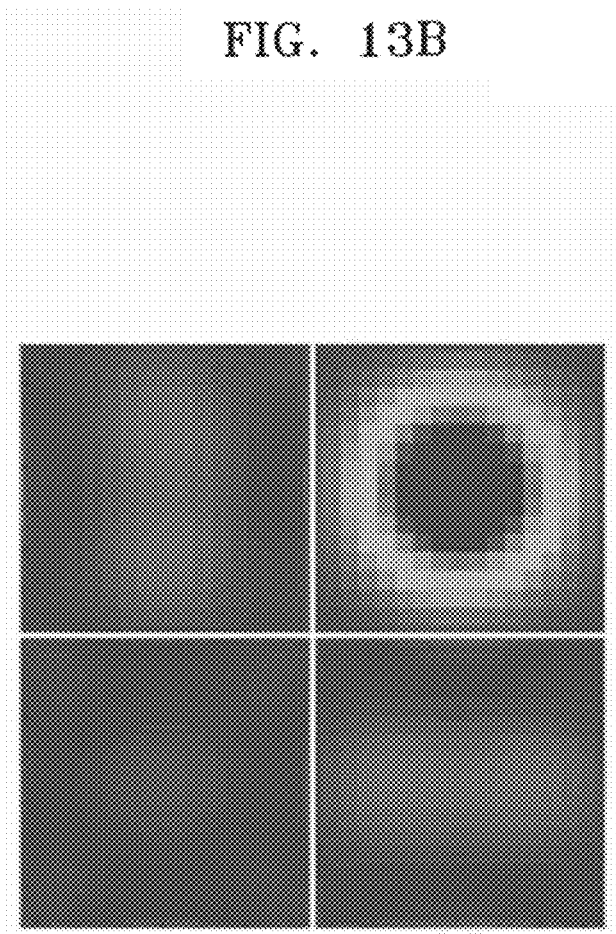

ated on Sep. 10, 2020, in the Korean Intellectual Property
IMAGE SENSOR INCLUDING COLOR SEPARATING LENS ARRAY, INCLUDING REGIONS OF DIFFERENT PATTERNS, AND ELECTRONIC APPARATUS INCLUDING THE IMAGE SENSOR

CROSS-REFERENCE TO RELATED APPLICATIONS

This application claims priority to Korean Patent Application No. 10-2019-0132386, filed on Oct. 23, 2019, Korean Patent Application No. 10-2019-0146233, filed on Nov. 14, 2019, and Korean Patent Application No. 10-2020-0116388, filed on Sep. 10, 2020, in the Korean Intellectual Property Office, the disclosures of which are incorporated herein in their entireties by reference.

BACKGROUND

1. Field

Example embodiments of the present disclosure relate to an image sensor including a color separating lens array and an electronic apparatus including the image sensor, and more particularly, to an image sensor including a color separating lens array capable of separating incident light according to wavelengths and condensing the separated light, and an electronic apparatus including the image sensor.

2. Description of Related Art

Image sensors generally detect a color of incident light by using a color filter. However, a color filter may have a low light utilization efficiency because the color filter absorbs light of other colors except for light of detected color.

For example, when an RGB (red, green, and blue) color filter is used, only ⅓ of the incident light is transmitted and the other, that is, ⅔ of the incident light, is absorbed by the RGB color filter. Thus, the light utilization efficiency is only about 33%. Therefore, in a color display apparatus or a color image sensor, most light loss occurs in the color filter.

SUMMARY

One or more example embodiments provide an image sensor with improved light utilization efficiency by using a color separating lens array configured to separate and condense incident light according to wavelengths.

One or more example embodiments also provide an electronic apparatus including an image sensor.

Additional aspects will be set forth in part in the description which follows and, in part, will be apparent from the description, or may be learned by practice of example embodiments.

According to an aspect of an example embodiment, there is provided an image sensor including a sensor substrate including a first photo-sensing cell and a second photo-sensing cell respectively configured to sense light, a spacer layer that is transparent and disposed on the sensor substrate, and a color separating lens array disposed on the spacer layer opposite to the sensor substrate, the color separating lens array including a first region disposed opposite to the first photo-sensing cell in a vertical direction, the first region having a first pattern, and a second region disposed opposite to the second photo-sensing cell in the vertical direction, the second region having a second pattern that is different from the first pattern, and wherein the first pattern is configured to separate, from incident light incident on the color separating lens array, light of a first wavelength and condense the light of the first wavelength to the first photo-sensing cell, and the second pattern is configured to separate, from the incident light, light of a second wavelength that is different from the first wavelength, and condense the light of the second wavelength to the second photo-sensing cell.

A thickness of the spacer layer may correspond to a focal length of the color separating lens array with respect to a center wavelength of a wavelength band of the incident light to be separated by the color separating lens array.

Where a theoretical thickness of the spacer layer is $h_t$, a pitch between adjacent photo-sensing cells is p, a refractive index of the spacer layer is n, and a center wavelength of a wavelength band of the incident light to be separated by the color separating lens array is $\lambda_0$, the theoretical thickness of the spacer layer may satisfy $$h_t = \frac{np^2}{\lambda_0} - \frac{\lambda_0}{4n},$$

and an actual thickness h of the spacer layer may satisfy $h_t - p \leq h \leq h_t + p$.

The first pattern and the second pattern may be configured such that the light of the first wavelength, at a position immediately after passing through the color separating lens array, forms a phase distribution of $2N\pi$ at a position corresponding to a center of the first photo-sensing cell and forms a phase distribution of $(2N-1)\pi$ at a position corresponding to a center of the second photo-sensing cell, where N is an integer greater than 0.

The first pattern and the second pattern may be configured such that the light of the second wavelength, at the position immediately after passing through the color separating lens array, forms a phase distribution of $(2M-1)\pi$ at a position corresponding to the center of the first photo-sensing cell and forms a phase distribution of $2M\pi$ at a position corresponding to the center of the second photo-sensing cell, where M is an integer greater than 0.

The first region may include a first dielectric having a first refractive index and forming the first pattern, and a second dielectric having a second refractive index that is less than the first refractive index and filled in the first dielectric, wherein the first pattern is formed such that the first dielectric is included in any vertical cross section of the first region.

The second region may include a first dielectric having a first refractive index and forming the second pattern, and a second dielectric having a second refractive index that is less than the first refractive index and filled in the first dielectric, wherein the second pattern is formed such that the first dielectric is included in any vertical cross section of the second region.

The sensor substrate may further include a third photo-sensing cell and a fourth photo-sensing cell, and the color separating lens array may further include a third region disposed opposite to the third photo-sensing cell in the vertical direction, the third region having a third pattern that is different from the first pattern and the second pattern, and a fourth region disposed opposite to the fourth photo-sensing cell in the vertical direction, the fourth region having a fourth pattern different from the first pattern, the second pattern, and the third pattern.

The third region may be disposed adjacent to the first region and at a diagonal direction of the second region, and the fourth region may be disposed adjacent to the second region and at a diagonal direction of the first region, and the third pattern may be configured to separate, from the incident light, light of a third wavelength that is different from the first wavelength and the second wavelength, and condense the light of the third wavelength to the third photo-sensing cell, and the fourth pattern may be configured to separate, from the incident light, the light of the first wavelength and condense the light of the first wavelength to the fourth photo-sensing cell.

The first pattern, the second pattern, the third pattern, and the fourth pattern may be configured such that the light of the first wavelength, at a position immediately after passing through the color separating lens array, forms a phase distribution of $2N\pi$ at positions corresponding to centers of the first photo-sensing cell and the fourth photo-sensing cell, and forms a phase distribution of $(2N-1)\pi$ at positions corresponding to centers of the second photo-sensing cell and the third photo-sensing cell, where N is an integer greater than 0.

The first pattern, the second pattern, the third pattern, and the fourth pattern may be configured such that the light of the second wavelength, at a position immediately after passing through the color separating lens array, forms a phase distribution of $(2M-1)\pi$ at positions corresponding to the centers of the first photo-sensing cell and the fourth photo-sensing cell, forms a phase distribution of $2M\pi$ at a position corresponding to the center of the second photo-sensing cell, and forms a phase distribution that is greater than $(2M-2)\pi$ and less than $(2M-1)\pi$ at a position corresponding to the center of the third photo-sensing cell, where M is an integer greater than 0.

The first pattern, the second pattern, the third pattern, and the fourth pattern may be configured such that the light of the third wavelength, at a position immediately after passing through the color separating lens array, forms a phase distribution of $(2L-1)\pi$ at positions corresponding to the centers of the first photo-sensing cell and the fourth photo-sensing cell, forms a phase distribution that is greater than $(2L-2)\pi$ and less than $(2L-1)\pi$ at a position corresponding to the center of the second photo-sensing cell, and forms a phase distribution of $2L\pi$ at a position corresponding to the center of the third photo-sensing cell, where L is an integer greater than 0.

The first pattern, the second pattern, the third pattern, and the fourth pattern may be configured such that, among the incident light incident on the first region of the color separating lens array, the light of the first wavelength travels toward the center of the first photo-sensing cell corresponding to the first region, the light of the second wavelength travels toward the center of the second photo-sensing cell adjacent to the first photo-sensing cell corresponding to the first region, and the light of the third wavelength travels toward the center of the third photo-sensing cell adjacent to the first photo-sensing cell corresponding to the first region.

The first pattern, the second pattern, the third pattern, and the fourth pattern may be configured such that, among the incident light incident on the second region of the color separating lens array, the light of the second wavelength travels toward the center of the second photo-sensing cell corresponding to the second region, the light of the first wavelength travels toward the centers of the first photo-sensing cell and the fourth photo-sensing cell adjacent to the second photo-sensing cell corresponding to the second region, and the light of the third wavelength travels toward the center of the third photo-sensing cell adjacent to the second photo-sensing cell corresponding to the second region.

The first pattern, the second pattern, the third pattern, and the fourth pattern may be configured such that, among the incident light incident on the third region of the color separating lens array, the light of the third wavelength travels toward the center of the third photo-sensing cell corresponding to the third region, the light of the first wavelength travels toward the centers of the first photo-sensing cell and the fourth photo-sensing cell adjacent to the third photo-sensing cell corresponding to the third region, and the light of the second wavelength travels toward the center of the second photo-sensing cell adjacent to the third photo-sensing cell corresponding to the third region.

The first pattern, the second pattern, the third pattern, and the fourth pattern may be configured such that, among the incident light incident on the fourth region of the color separating lens array, the light of the first wavelength travels toward the center of the fourth photo-sensing cell corresponding to the fourth region, the light of the second wavelength travels toward the center of the second photo-sensing cell adjacent to the fourth photo-sensing cell corresponding to the fourth region, and the light of the third wavelength travels toward the center of the third photo-sensing cell adjacent to the fourth photo-sensing cell corresponding to the fourth region.

The light of the first wavelength may be green light, the light of the second wavelength may be blue light, and the light of the third wavelength may be red light.

The first pattern and the fourth pattern may have two-fold symmetry, the second pattern and the third pattern may have four-fold symmetry, and the fourth pattern may have a same shape as the first pattern that is rotated by 90 degrees.

The color separating lens array may further include a plurality of unit pattern arrays each including the first region, the second region, the third region, and the fourth region adjacent to each other, and the plurality of unit pattern arrays may be repeatedly disposed two-dimensionally.

The color separating lens array may further include a plurality of first regions, a plurality of second regions, a plurality of third regions, and a plurality of fourth region that are disposed to protrude with respect to edges of the sensor substrate and do not face any photo-sensing cell of the sensor substrate in the vertical direction.

The image sensor may further include a color filter layer disposed between the sensor substrate and the spacer layer, the color filter layer including a plurality of color filters.

According to another aspect of an example embodiment, there is provided an image sensor including a sensor substrate including a first photo-sensing cell, a second photo-sensing cell, a third photo-sensing cell, and a fourth photo-sensing cell respectively configured to sense light, a spacer layer that is transparent and disposed on the sensor substrate, and a color separating lens array disposed on the spacer layer opposite to the sensor substrate, the color separating lens array including a first region disposed opposite to the first photo-sensing cell in a vertical direction, the first region having a first pattern, a second region disposed opposite to the second photo-sensing cell in the vertical direction, the second region having a second pattern that is different from the first pattern, a third region disposed opposite to the third photo-sensing cell in the vertical direction, the third region having a third pattern that is different from the first pattern and the second pattern, and a fourth region disposed opposite to the fourth photo-sensing cell in the vertical direction, the fourth region having a fourth pattern that is different from the first pattern, the second pattern, and the third pattern, wherein the third region is disposed adjacent to the first region and at a diagonal direction of the second region, and the fourth region is disposed adjacent to the second region and at a diagonal direction of the first region, wherein the first pattern and the fourth pattern have two-fold symmetry, the second pattern and the third pattern have four-fold symmetry, and wherein the fourth pattern has a same shape as the first pattern that is rotated by 90 degrees.

The first pattern may be configured to separate, from incident light incident on the color separating lens array, light of a first wavelength and condense the light of the first wavelength to the first photo-sensing cell, the second pattern may be configured to separate, from the incident light, light of a second wavelength and condense the light of the second wavelength to the second photo-sensing cell, the third pattern may be configured to separate, from the incident light, light of a third wavelength and condense the light of the third wavelength to the third photo-sensing cell, and the fourth pattern may be configured to separate, from the incident light, light of the first wavelength and condense the light of the first wavelength to the fourth photo-sensing cell.

According to another aspect of an example embodiment, there is provided an imaging apparatus including an objective lens configured to focus light reflected from an object and form an optical image, and an image sensor configured to convert the optical image formed by the objective lens into an electric image signal, the image sensor including a first photo-sensing cell and a second photo-sensing cell respectively configured to sense light, a spacer layer that is transparent and disposed on the sensor substrate, and a color separating lens array disposed on the spacer layer opposite to the sensor substrate, the color separating lens array including a first region disposed opposite to the first photo-sensing cell in a vertical direction, the first region having a first pattern, and a second region disposed opposite to the second photo-sensing cell in the vertical direction, the second region having a second pattern that is different from the first pattern, and wherein the first pattern is configured to separate, from incident light incident on the color separating lens array, light of a first wavelength and condense the light of the first wavelength to the first photo-sensing cell, and the second pattern is configured to separate, from the incident light, light of a second wavelength that is different from the first wavelength, and condense the light of the second wavelength to the second photo-sensing cell.

An electronic apparatus may include the imaging apparatus.

According to yet another aspect of an example embodiment, there is provided an n image sensor including a sensor substrate including a first photo-sensing cell, a second photo-sensing cell, a third photo-sensing cell, and a fourth photo-sensing cell respectively configured to sense light, a spacer layer that is transparent and disposed on the sensor substrate, and a color separating lens array disposed on the spacer layer opposite to the sensor substrate, the color separating lens array including a first region disposed opposite to the first photo-sensing cell in a vertical direction, the first region being configured to separate, from incident light incident on the color separating lens array, light of a first wavelength and condense the light of the first wavelength to the first photo-sensing cell, a second region disposed opposite to the second photo-sensing cell in the vertical direction, the second region being configured to separate, from the incident light, light of a second wavelength that is different from the first wavelength and condense the light of the second wavelength to the second photo-sensing cell, a third region disposed opposite to the third photo-sensing cell in the vertical direction, the third region being configured to separate, from the incident light, light of a third wavelength that is different from the first wavelength and the second wavelength, and condense the light of the third wavelength to the third photo-sensing cell, and a fourth region disposed opposite to the fourth photo-sensing cell in the vertical direction, the fourth region being configured to separate, from the incident light, light of the first wavelength and condense the light of the first wavelength to the fourth photo-sensing cell.

The first region may have a first pattern, the second region may have a second pattern that is different from the first pattern, the third region may have a third pattern that is different from the first pattern and the second pattern, respectively, and the fourth region may have a same pattern as the first pattern that is rotated 90 degrees.

BRIEF DESCRIPTION OF THE DRAWINGS

The above and/or other aspects, features, and advantages of example embodiments will be more apparent from the following description taken in conjunction with the accompanying drawings, in which:

FIGS. 2A, 2B, and 2C show various example pixel arrangements of a pixel array of the image sensor according to example embodiments;

FIG. 10B is a diagram showing a pixel and peripheral pixels in an image sensor, wherein the pixel corresponds to the second region according to an example embodiment;

FIG. 11B is a diagram showing a pixel and peripheral pixels in an image sensor, wherein the pixel corresponds to the third region according to an example embodiment;

FIGS. 13A and 13B are diagrams that simulate a phase distribution of blue light passing through the color separating lens array and a focusing distribution of blue light in an facing photo-sensing cell according to an example embodiment.

DETAILED DESCRIPTION

Figure 1:
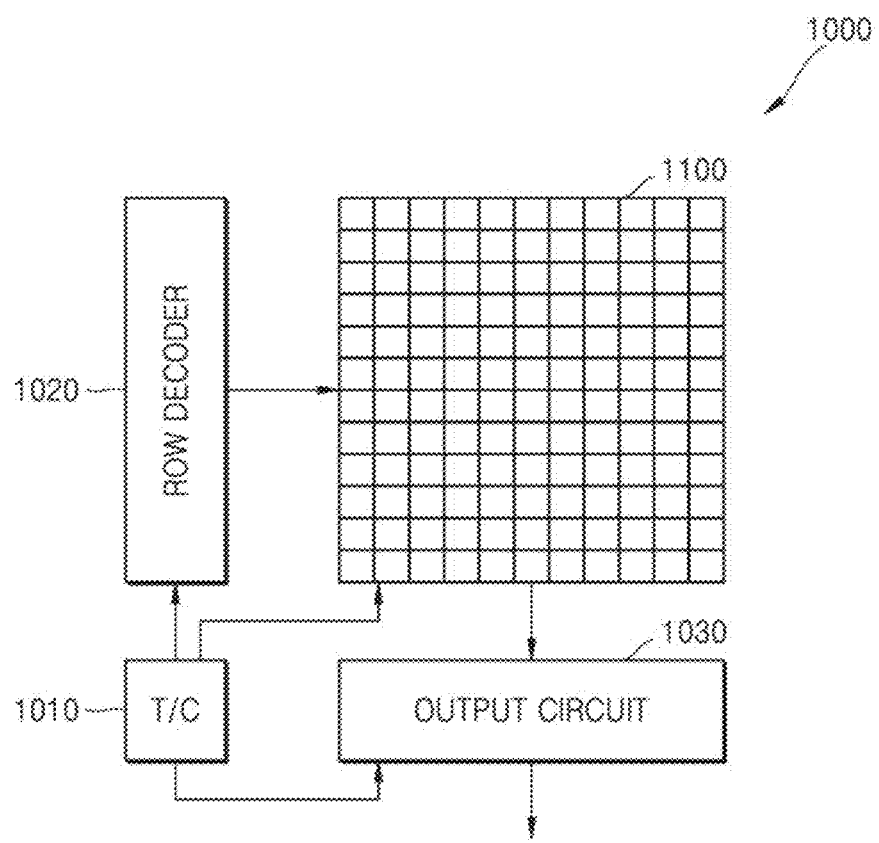
FIG. 1 is a block diagram of an image sensor according to an example embodiment.

Reference will now be made in detail to example embodiments of which are illustrated in the accompanying drawings.

In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Hereinafter an image sensor including a color separating lens array and an electronic apparatus including the image sensor will be described in detail with reference to accompanying drawings.

In the drawings, like reference numerals denote like components, and sizes of components in the drawings may be exaggerated for convenience of explanation. The example embodiments are capable of various modifications and may be embodied in many different forms. In a layer structure described below, an expression such as "above" or "on" may include not only the meaning of immediately on/under/to the left/to the right in a contact manner, but also the meaning of on/under/to the left/to the right in a non-contact manner. Hereinafter, an image sensor including a color separating lens array and an electronic apparatus including the image sensor will be described in detail with reference to the accompanying drawings.

The example embodiments are capable of various modifications and may be embodied in many different forms.

Terms such as "first" and "second" may be used to describe various components, but are used only for the purpose of distinguishing one component from other components. These terms are not intended to limit differences in materials or structures of components. The singular forms include the plural forms unless the context clearly indicates otherwise.

In addition, it should be understood that, when a part "comprises" or "includes" an element in the specification, unless otherwise defined, it is not excluding other elements but may further include other elements. In addition, terms such as "unit" and "module" described in the specification mean units that process functions or operations, which may be implemented as hardware or software, or as a combination of hardware and software.

The term such as "the", "above" and similar directional terms may be applied to both singular and plural. The operations constituting the method may be performed in any suitable order unless there is a clear statement that the operations should be performed in the order described.

In addition, the use of all exemplary terms such as "for example," "e.g.," "etc." is merely for describing in detail the technical idea, and the scope of the rights is not limited by these terms unless limited by claims.

FIG. 1 is a block diagram of an image sensor 1000 according to an example embodiment.

Referring to FIG. 1, the image sensor 1000 may include a pixel array 1100, a timing controller 1010, a row decoder 1020, and an output circuit 1030. The image sensor may include a charge coupled device (CCD), an image sensor or a complementary metal oxide semiconductor (CMOS) image sensor. The pixel array 1100 includes pixels disposed two-dimensionally along a plurality of rows and columns.

The row decoder 1020 selects one of the rows of the pixel array 1100 in response to the row address signal output from the timing controller 1010. The output circuit 1030 outputs a light sensing signal in column units from a plurality of pixels disposed along the selected row.

To this end, the output circuit 1030 may include a column decoder and an analog to digital converter (ADC). For example, the output circuit 1030 may include a plurality of ADCs disposed for each column between the column decoder and the pixel array 1100, or one ADC disposed at an output terminal of the column decoder. The timing controller 1010, the row decoder 1020, and the output circuit 1030 may be implemented as a single chip or as separate chips.

Figure 2A:
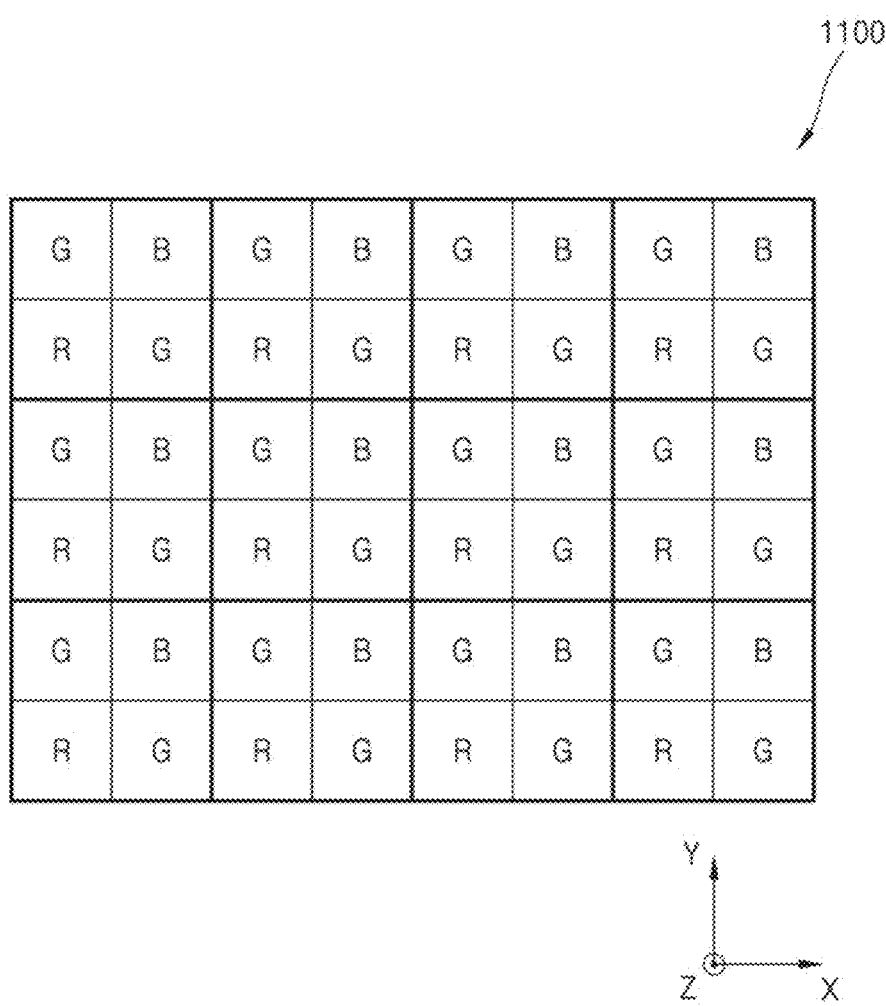
Figure 2B:
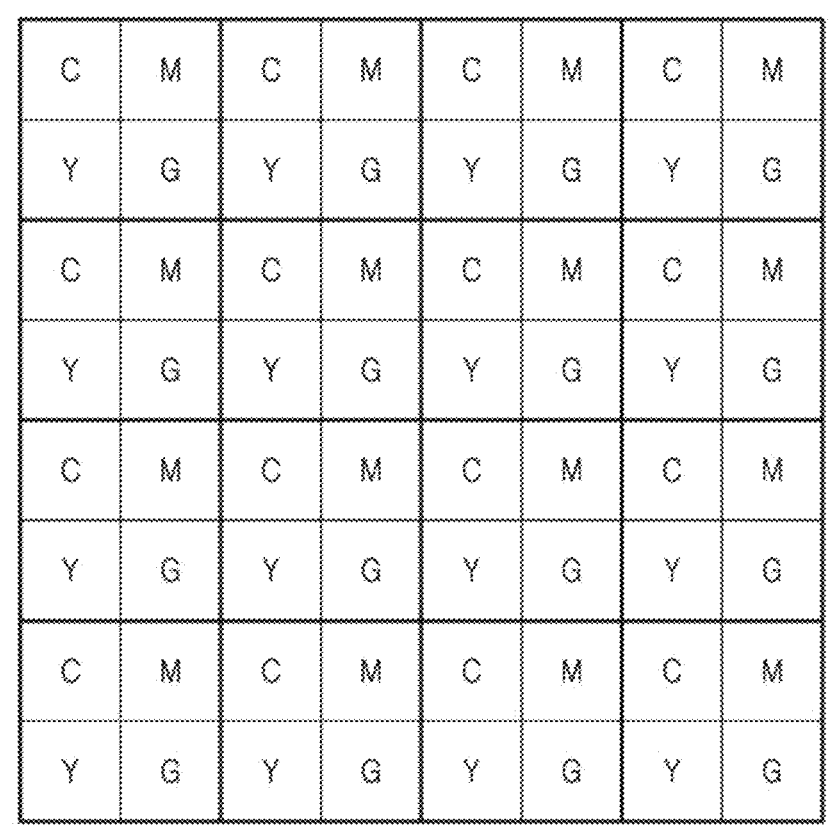
Figure 2C:
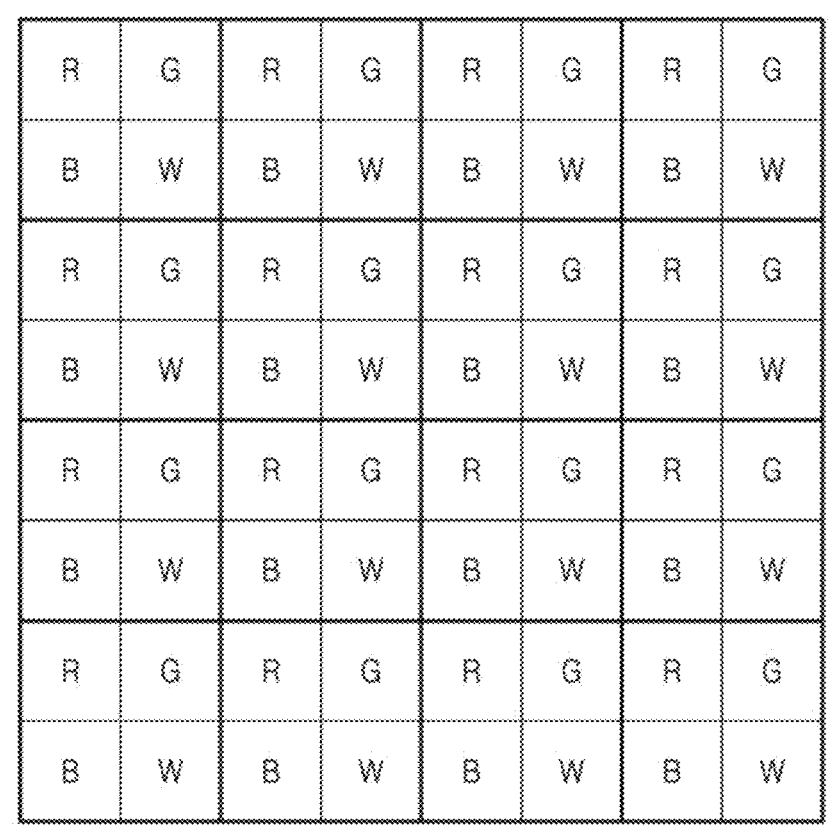

A processor for processing an image signal output through the output circuit 1030 may be implemented as a single chip together with the timing controller 1010, the row decoder 1020, and the output circuit 1030. The pixel array 1100 may include a plurality of pixels sensing light of different wavelengths. The pixels may be disposed in various types as shown in FIGS. 2A to 2C. First, FIG. 2A shows a Bayer pattern that is generally adopted in an image sensor 1000.

Referring to FIG. 2A, one unit pixel includes four quadrant regions, and the first quadrant may be a blue pixel B, the second quadrant may be a green pixel G, the third quadrant may be a red pixel R, and the fourth quadrant may be a green pixel G, respectively. These unit pixels are repeatedly disposed two-dimensionally in a first direction (X-direction) and a second direction (Y-direction).

For example, two green pixels G are disposed in one diagonal direction within a 2×2 array-type unit pixel, and one blue pixel B and one red pixel R are disposed in the other diagonal direction. In an overall pixel arrangement, a first row in which a plurality of green pixels G and a plurality of blue pixels B are alternately disposed in the first direction, and a second row in which a plurality of red pixels R and a plurality of green pixels G are alternately disposed in the first direction are repeatedly disposed. However, the arrangement type of the pixel array 1100 is not limited to the Bayer pattern, and there may be various arrangement types other than the Bayer pattern. For example, referring to FIG. 2B, the arrangement type of the pixel array may include a CYGM type in which a magenta pixel M, a cyan pixel C, a yellow pixel Y, and a green pixel G constitute one unit pixel. In addition, referring to FIG. 2C, arrangement of an RGBW type in which green pixel G, red pixel R, blue pixel B, and white pixel W constitute one unit pixel is also possible.

According to an example embodiment, the unit pixel may have a 3×2 array form. In addition, the pixels of the pixel array 1100 may be disposed in various types according to color characteristics of the image sensor 1000.

Figure 3:
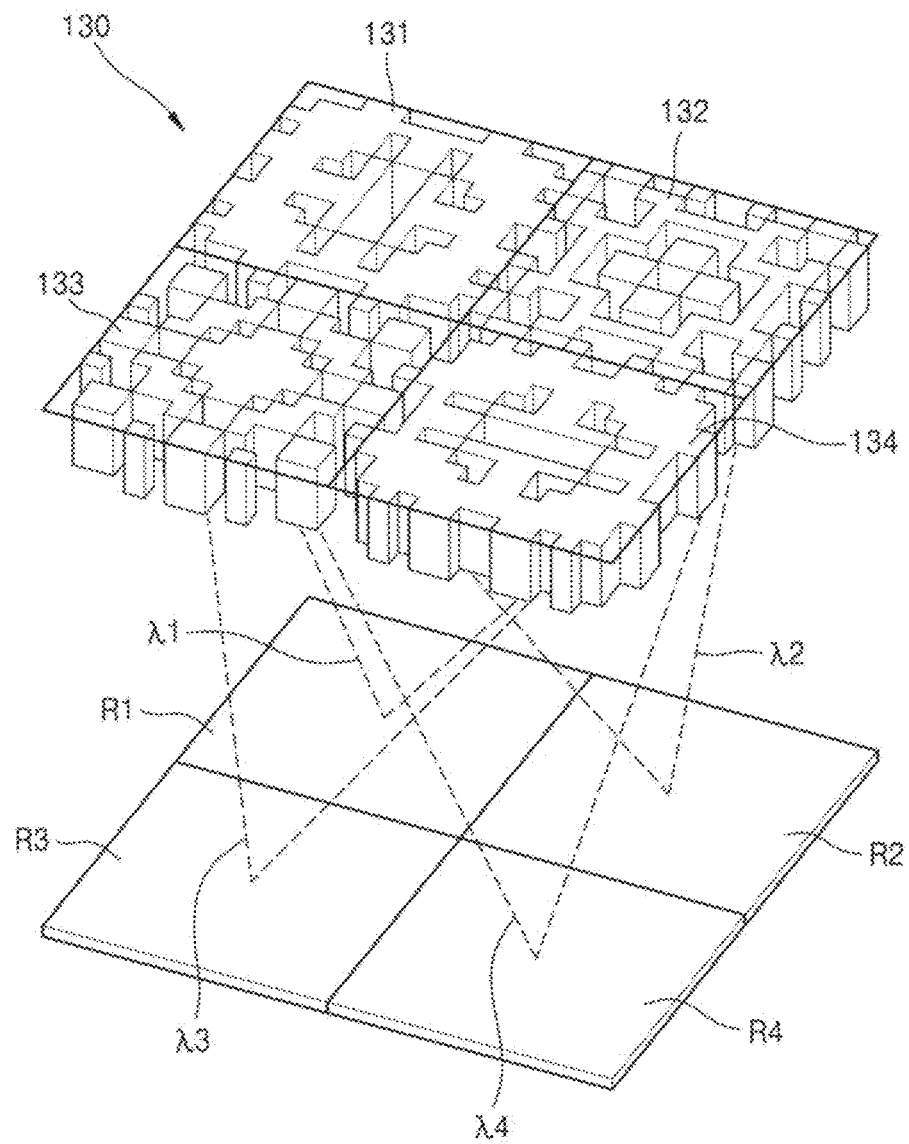
FIG. 3 is a conceptual diagram showing a structure and operation of a color separating lens array according to an example embodiment.

Hereinafter, for convenience, the pixel array 1100 of the image sensor 1000 is described as having a Bayer pattern, but the principles of the example embodiments described below may be applied to a pixel arrangement other than a Bayer pattern. According to an example embodiment, the pixel array 1100 of the image sensor 1000 may include a color separating lens array configured to branch and condense light of a corresponding color to each pixel. FIG. 3 is a conceptual diagram showing a structure and operation of a color separating lens array 130 according to an example embodiment. Referring to FIG. 3, a unit pattern array of the color separating lens array 130 may include a first region 131, a second region 132, a third region 133, and a fourth region 134 each having a first pattern, a second pattern, a third pattern, and a fourth pattern that are distinguished from each other. For example, the first region 131 may have a first pattern, the second region 132 may have a second pattern patterned in a different form from the first pattern, the third region 133 may have a third pattern patterned in a form different from the first pattern and the second pattern, and the fourth region 134 may have a fourth pattern patterned in a form different from the first to third patterns. The first to fourth regions 131, 132, 133, and 134 may be disposed on the same plane in the form of, for example, 2×2.

Accordingly, the first region 131 and the second region 132 are disposed adjacent to each other in a first direction, and the third region 133 and the fourth region 134 are also disposed adjacent to each other in the first direction. In addition, the first region 131 and the third region 133 are disposed adjacent to each other in a second direction perpendicular to the first direction, and the third region 133 and the fourth region 134 are also disposed adjacent to each other in the second direction. The first region 131 and the fourth region 134 are disposed in a diagonal direction, and the second region 132 and the third region 133 are disposed in a different diagonal direction. According to an example embodiment, the first to fourth patterns may be determined such that, among incident light incident on the color separating lens array 130, first wavelength light $\lambda 1$ may travel toward and be condensed in a first target region R1 facing the first region 131 in the vertical direction, second wavelength light $\lambda 2$ may travel toward and be condensed in a second target region R2 facing the second region 132 in the vertical direction, third wavelength light $\lambda 3$ may travel toward and be condensed in a third target region R3 facing the third region 133 in the vertical direction, and fourth wavelength light $\lambda 4$ is condensed in a fourth target region R4 facing the fourth region 134 in the vertical direction. The specific patterns of the first to fourth regions 131, 132, 133 and 134 may be variously designed according to the pixel arrangement and color characteristics of the image sensor to which the color separating lens array 130 is applied.

When the color separating lens array 130 shown in FIG. 3 is applied to the Bayer pattern type image sensor shown in FIG. 2A, the first region 131 and the fourth region 134 may be disposed to face the green pixel G, the second region 132 may be disposed to face the blue pixel B, and the third region 133 may be disposed to face the red pixel R. In addition, the first wavelength light $\lambda 1$ and the fourth wavelength light $\lambda 4$ may be green light, the second wavelength light $\lambda 2$ may be blue light, and the third wavelength light $\lambda 3$ may be red light.

Figure 4:
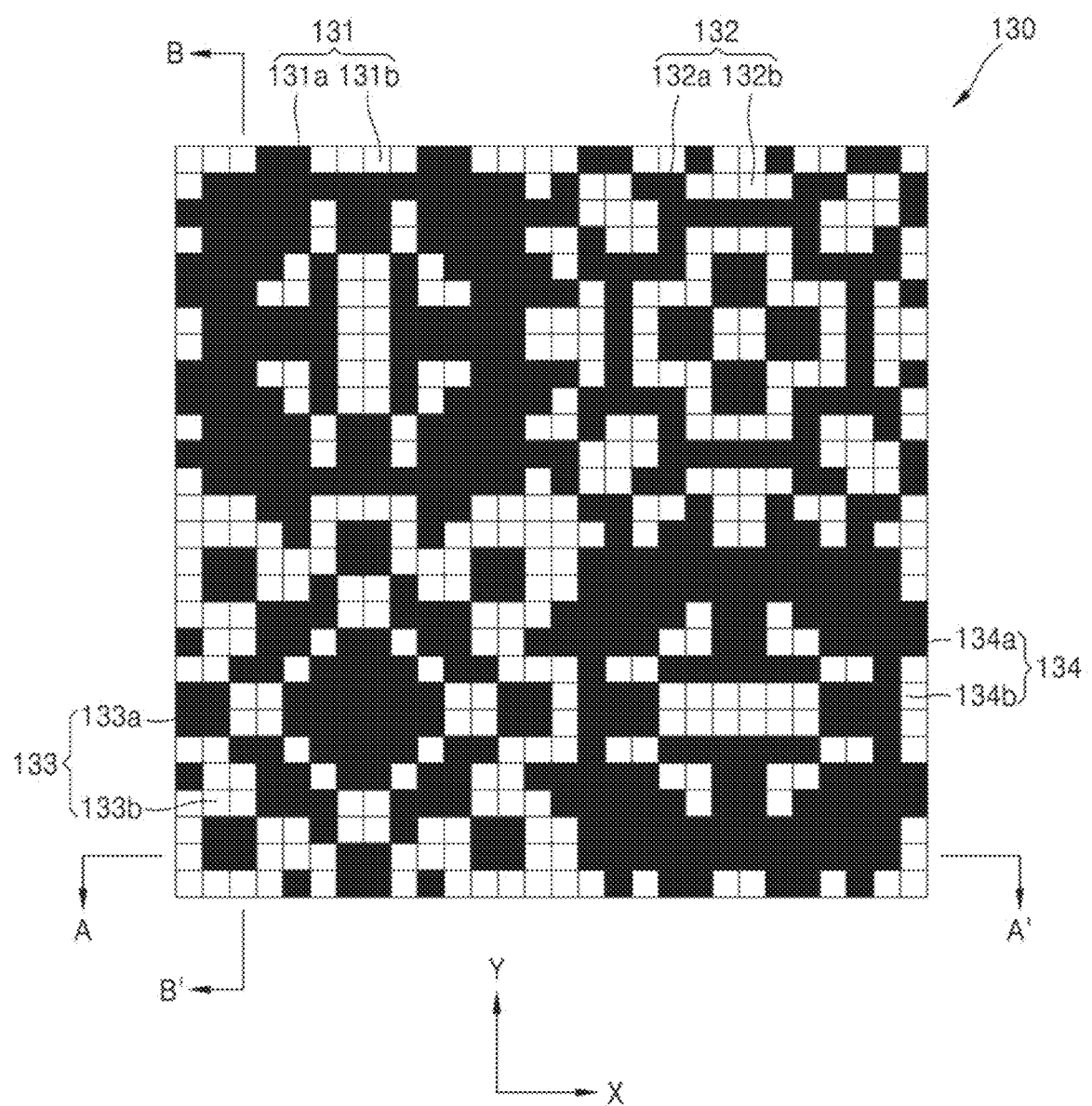
FIG. 4 is a plan view showing a unit pattern array of a color separating lens array applicable to a Bayer pattern type image sensor according to an example embodiment.

FIG. 4 is a plan view showing a unit pattern array of a color separating lens array applicable to a Bayer pattern type image sensor according to an example embodiment. Referring to FIG. 4, the first region 131 facing the green pixel G includes a first dielectric 131a forming a first pattern and a second dielectric 131b filled in the first dielectric 131a. The second region 132 facing the blue pixel B includes a first dielectric 132a forming a second pattern and a second dielectric 132b filled in the first dielectric 132a, the third region 133 facing the red pixel R includes a first dielectric 133a forming a third pattern and a second dielectric 133b filled in the first dielectric 133a, and the fourth region 134 facing the green pixel G includes a first dielectric 134a forming a fourth pattern and a second dielectric 134b filled in the first dielectric 134a.

Both the first region 131 and the fourth region 134 face the green pixel, and thus may have the same shape, but their rotation directions may be different. For example, as shown in FIG. 4, the pattern of the fourth region 134 may have the same shape as the pattern of the first region 131 in a state where the first region 131 is rotated by 90 degrees. This rotation and difference may be due to the arrangement of adjacent pixels. For example, the colors of the adjacent pixels may be rotated by 90 degrees between the first region 131 and the fourth region 134. In the case of FIG. 4, blue pixels B are disposed on the left side and right side of a green pixel G facing the first region 131, and red pixels B are disposed on the left side and right side of a green pixel G facing the fourth region 134. Due to the difference in the arrangement of the adjacent pixels, patterns having the same shape and disposed in different rotation directions may be formed as described above. The first dielectrics 131a, 132a, 133a, and 134a may include the same material as each other, and the second dielectrics 131b, 132b, 133b, and 134b may also include the same material as each other. For example, the first dielectrics 131a, 132a, 133a, and 134a may include a dielectric material having a relatively high refractive index and having a relatively low absorption rate in a visible light band, such as tin oxide ($TIO_2$), gallium nitride (GaN), silicon nitride ($SiN_3$), zinc sulfide (ZnS), zinc selenide (ZnSe), silicon nitride ($Si_3N_4$), and the second dielectrics 131b, 132b, 133b, and 134b may include a dielectric material having a relatively low refractive index and having a relatively low absorption rate in the visible light band, such as air, silicon oxide ($SiO_2$), and silanol-based spin on glass (SOG). When the second dielectrics 131b, 132b, 133b, and 134b includes air, the color separating lens array 130 shown in FIG. 4 can be more easily formed by etching the first dielectrics 131a, 132a, 133a, and 134a.

Figure 5:
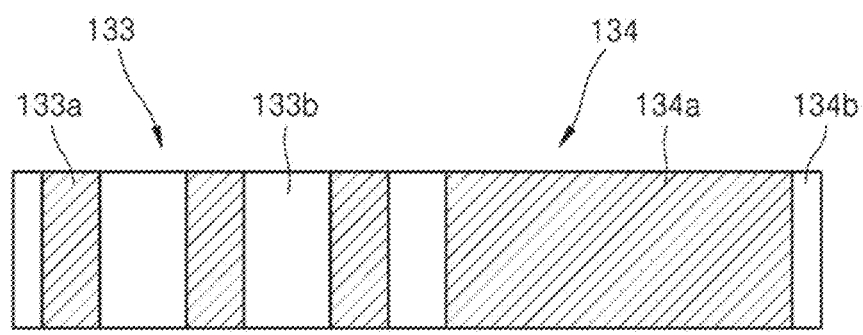
FIG. 5 is a cross-sectional view showing a cross section of a unit pattern array of FIG. 4 taken along line A-A'.
Figure 6:
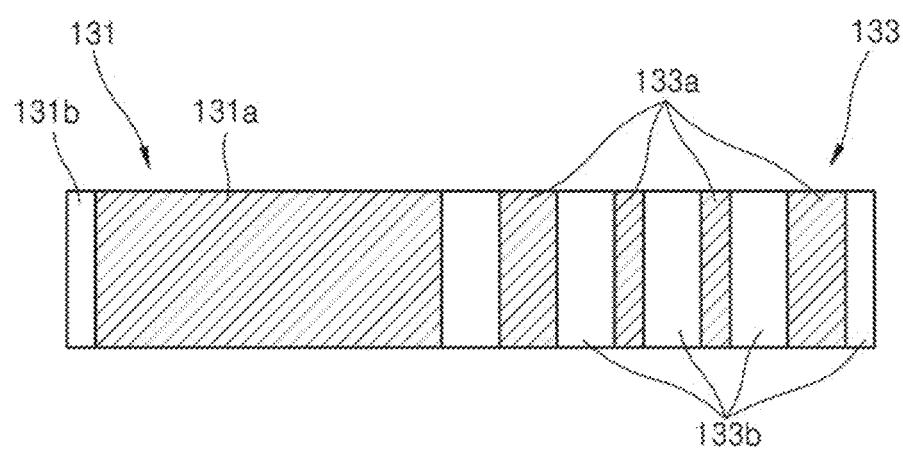
FIG. 6 is a cross-sectional view showing a cross section of the unit pattern array of FIG. 4 taken along line B-B'.

Also, FIG. 5 is a cross-sectional view of the unit pattern array of FIG. 4 taken along line A-A' (X-direction), and FIG. 6 is a cross-sectional view of the unit pattern array of FIG. 4 taken along line B-B' (Y-direction). Referring to FIGS. 5 and 6, the first dielectrics 131a, 132a, 133a, and 134a and the second dielectrics 131b, 132b, 133b, and 134b may extend in parallel with each other in the vertical direction.

Shapes of the vertical cross sections shown in FIGS. 5 and 6 are exemplary, and the shapes of the vertical cross sections of the first to fourth regions 131, 132, 133 and 134 may vary according to the positions of the A-A' line and the B-B' line.

For example, when line A-A' moves in the Y-direction, the shape of the vertical cross section shown in FIG. 5 changes, and when line B-B' moves in the X-direction, the shape of the vertical cross section shown in FIG. 6 become changes.

Regardless of this change in the shape of the vertical cross section, the first dielectrics 131a, 132a, 133a, and 134a and the second dielectrics 131b, 132b, 133b, and 134b may coexist in all vertical cross sections of the first to fourth regions 131, 132, 133, and 134.

Figure 7:
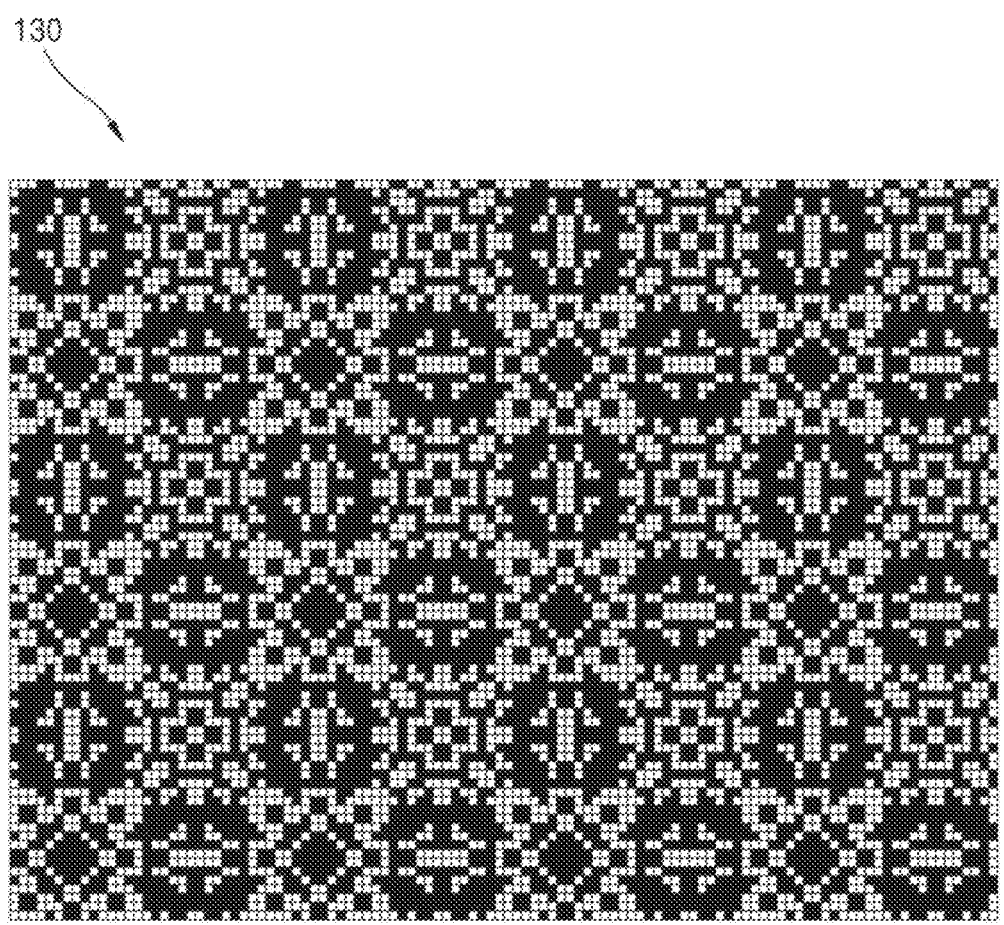
FIG. 7 is a plan view showing an arrangement of a color separating lens array including a plurality of unit pattern arrays shown in FIG. 4.

FIG. 7 is a plan view showing an arrangement of a color separating lens array including a plurality of unit pattern arrays shown in FIG. 4 according to an example embodiment. As shown in FIG. 7, the color separating lens array 130 may have a form in which the 2×2 unit pattern array shown in FIG. 4 is repeatedly disposed two-dimensionally.

Hereinafter, an example in which the above-described color separating lens array 130 is applied to the pixel array 1100 of the image sensor 1000 will be described in more detail.

Figure 8A:
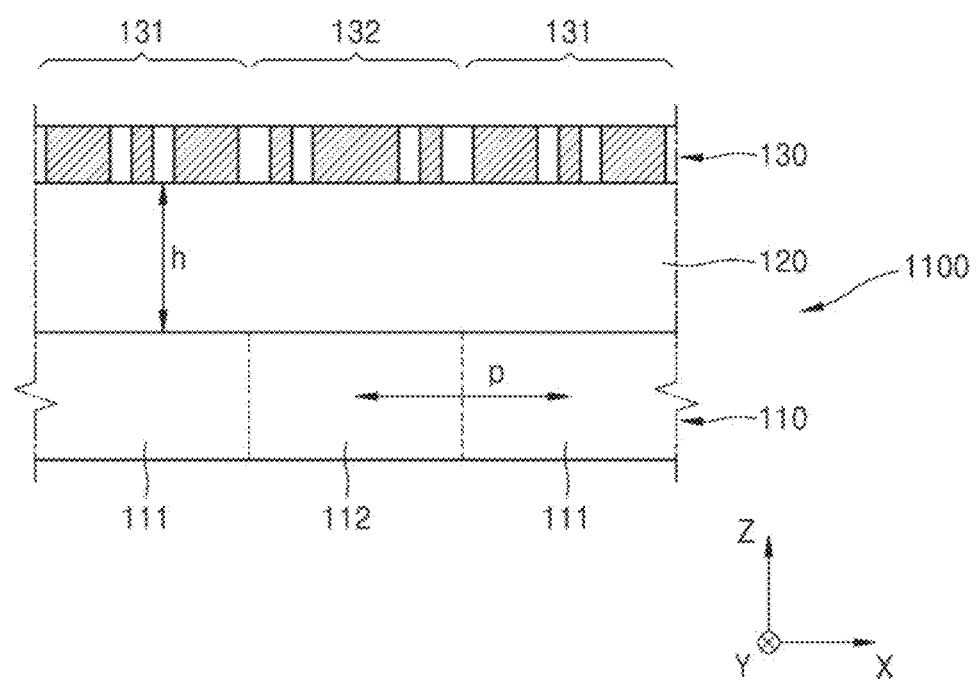
FIGS. 8A and 8B are cross-sectional views of a pixel array of an image sensor according to an example embodiment showing different cross sections.
Figure 8B:
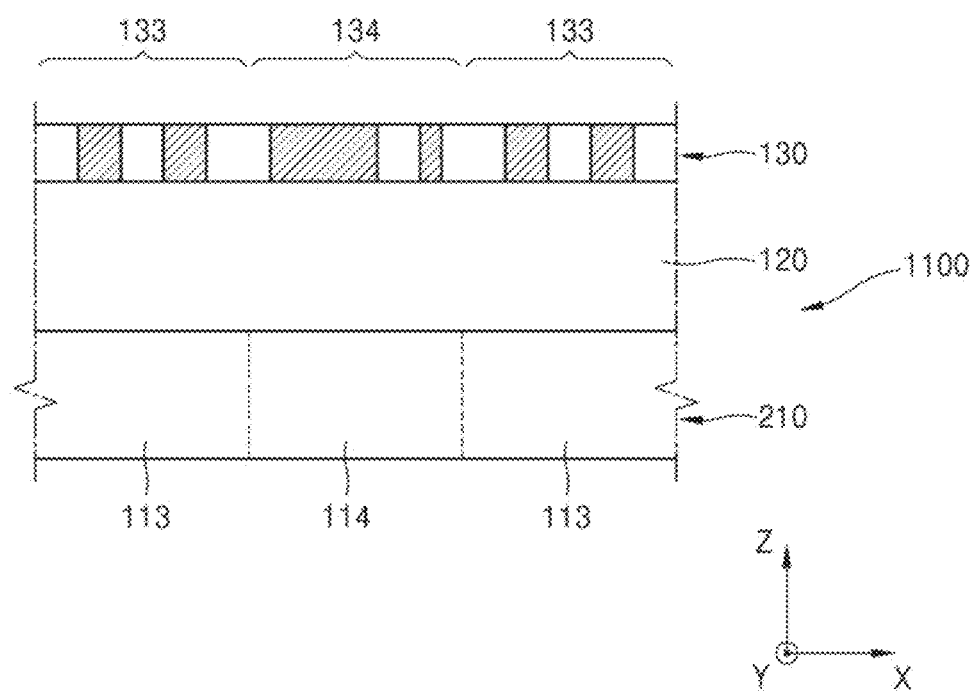

FIGS. 8A and 8B are cross-sectional views of a pixel array of an image sensor according to an example embodiment showing different cross sections; Referring to FIGS. 8A and 8B, the pixel array 1100 of the image sensor 1000 includes a sensor substrate 110 including a plurality of photo-sensing cells 111, 112, 113, and 114 for sensing light, a spacer layer 120 that is transparent and disposed on the sensor substrate 110, and a color separating lens array 130 disposed on the spacer layer 120. The sensor substrate 110 may include a first photo-sensing cell 111, a second photo-sensing cell 112, a third photo-sensing cell 113, and a fourth photo-sensing cell 114, which are configured to convert light into an electrical signal.

The first photo-sensing cell 111, the second photo-sensing cell 112, the third photo-sensing cell 113, and the fourth photo-sensing cell 114 may be alternately disposed. For example, as shown in FIG. 8A, the first photo-sensing cell 111 and the second photo-sensing cell 112 may be alternately disposed in the first direction (X-direction). In addition, in a cross section whose position in the Y-direction is different from a cross section shown in FIG. 8A, the third photo-sensing cell 113 and the fourth photo-sensing cell 114 may be alternately disposed as shown in FIG. 8B. The division of the area is for sensing incident light by dividing the incident light into a pixel unit. For example, the first photo-sensing cell 111 and the fourth photo-sensing cell 114 may sense light of a first wavelength corresponding to the first pixel, the second photo-sensing cell 112 may sense light of a second wavelength corresponding to the second pixel, and the third photo-sensing cell 113 may sense light of a third wavelength corresponding to the third pixel. Hereinafter, the light of the first wavelength may be green light, the light of the second wavelength may be blue light, and the light of the third wavelength may be red light, and the first pixel may be a green pixel G, the second pixel may be a blue pixel, and the third pixel may be a red pixel R, but embodiments are not limited thereto. A separator for separating cells may be further formed at the boundary between cells.

The spacer layer 120 is configured to support the color separating lens array 130 on the sensor substrate 110 and maintain a constant gap between the sensor substrate 110 and the color separating lens array 130. The spacer layer 120 may include a material transparent to visible light. For example, the spacer layer 120 may include a dielectric material, such as $SiO_2$ and siloxane-based spin on glass (SOG), having a refractive index lower than a refractive index of the first dielectrics 131a, 132a, 133a, and 134a of the color separating lens array 130 and having a relatively low absorption rate in the visible light band. The spacer layer 120 may include the same material as the second dielectrics 131b, 132b, 133b, and 134b. The color separating lens array 130 may include the first region 131 and the second region 132 alternately disposed in the first direction (X-direction) as shown in FIG. 8A, and the third region 133 and the fourth region 134 alternately disposed in the first direction (X-direction) in a cross section at a different position in the Y-direction as shown in FIG. 8B.

The first region 131 may be disposed to face the first photo-sensing cell 111 with the spacer layer 120 therebetween, the second region 132 may be disposed to face the second photo-sensing cell 112 with the spacer layer 120 therebetween, the third region 133 may be disposed to face the third photo-sensing cell 113 with the spacer layer 120 therebetween, and the fourth region 134 may be disposed to face the fourth photo-sensing cell 114 with the spacer layer 120 therebetween. According to the example embodiment, for example, in the incident light incident on the color separating lens array 130, the green light may be condensed on the first photo-sensing cell 111 facing the first region 131 in the vertical direction and on the fourth photo-sensing cell 114 facing the fourth region 134 in the vertical direction, the blue light may be condensed on the second photo-sensing cell 112 facing the second region 132 in the vertical direction, and the red light may be condensed on the third photo-sensing cell 113 facing the third region 133 in the vertical direction. In the color separating lens array 130 applied to the Bayer pattern type image sensor, the first to fourth patterns of the first to fourth regions 131, 132, 133, and 134 may have predetermined rules.

Figure 9A:
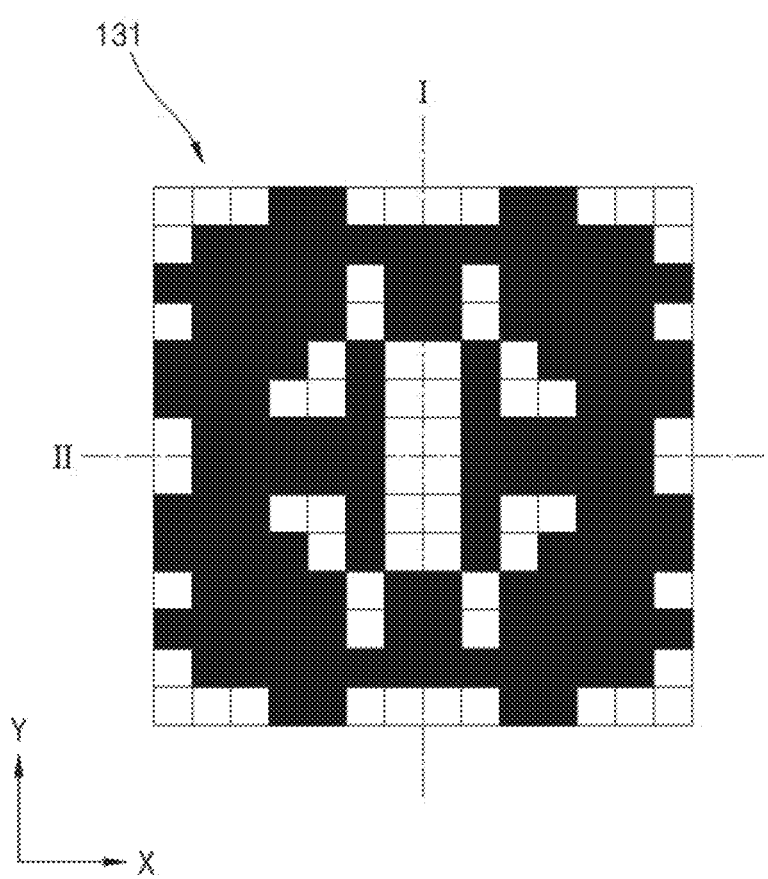
FIG. 9A is a diagram showing a first region in the unit pattern array of FIG. 4.
Figure 9B:
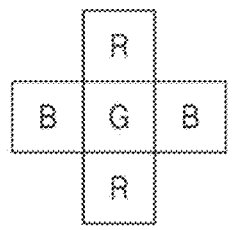
FIG. 9B is a diagram showing a pixel, which corresponds to the first region, and peripheral pixels in an image sensor.

For example, FIG. 9A shows a pattern of the first region 131 in the unit pattern array of FIG. 4 according to an example embodiment, and FIG. 9B shows a pixel, which corresponds to the first region, and peripheral pixels in the image sensor according to an example embodiment. Referring to FIG. 9B, blue pixels B are disposed at the left and right sides of the green pixel G corresponding to the first region 131, and red pixels R are disposed at the top and bottom sides of the green pixel G, respectively. Green pixels corresponding to the fourth region 134 are disposed in a diagonal direction of the green pixel G corresponding to the first region 131. Therefore, in order to obtain the same optical effect as the blue light among the transmitted light that has passed through the first region 131 travels in the left and right directions of the first region 131 and the red light among the transmitted light that has passed through the first region 131 travels in top and bottom directions of the first region 131, the first pattern of the first region 131 may have two-fold symmetry.

For example, as shown in FIG. 9A, the first pattern of the first region 131 may be symmetric about a first axis I in the Y-direction and symmetric about a second axis II in the X-direction.

Figure 10A:
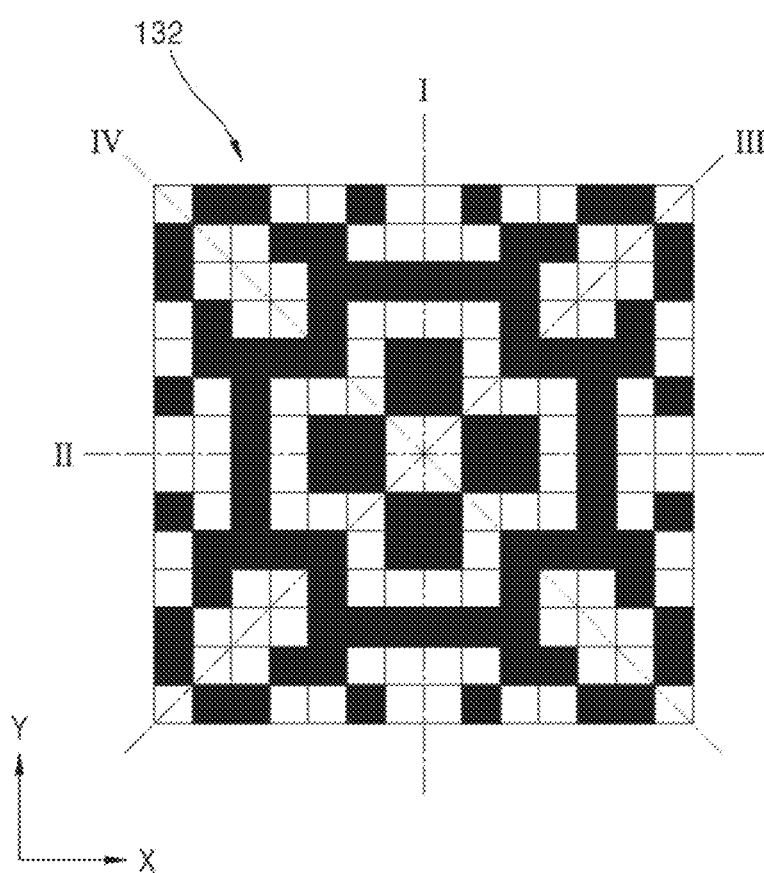
FIG. 10A is a diagram showing a second region in the unit pattern array of FIG. 4.
Figure 10B:
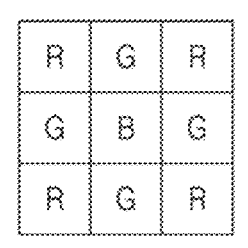

FIG. 10A shows a shape of the second region 132 in the unit pattern array of FIG. 4, and FIG. 10B shows a pixel, which corresponds to the second region 132, and peripheral pixels in the image sensor. Referring to FIG. 10B, green pixels G are disposed at the left, right, top, and bottom sides of the blue pixel B corresponding to the second region 132.

Figure 11A:
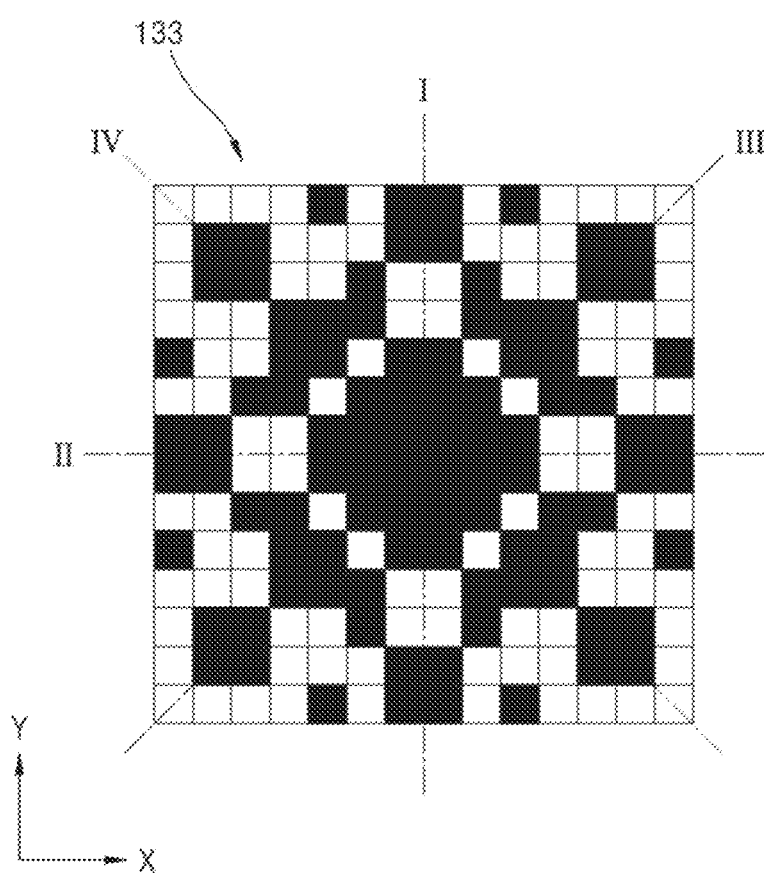
FIG. 11A is a diagram showing a third region in the unit pattern array of FIG. 4.

In addition, the red pixels R are disposed in two diagonal directions crossing each other. Therefore, in order to obtain the same optical effect as the green light among the transmitted light that has passed through the second region 132 travels in the left, right, top, and bottom directions of the second region 132, and the red light among the transmitted light that has passed through the second region 132 travels in the diagonal direction of the second region 132, the second pattern of the second region 132 may have four-fold symmetry. For example, as shown in FIG. 10A, the second pattern of the second region 132 may be symmetric about a first axis I in the Y-direction, about a second axis II in the X-direction, and about a third axis III and a fourth axis IV in the diagonal directions. FIG. 11A shows a shape of the third region 133 in the unit pattern array of FIG. 4, and FIG. 11B shows a pixel, which corresponds to the third region 133, and peripheral pixels in the image sensor.

Figure 11B:
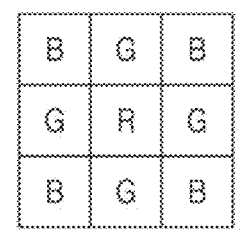

Referring to FIG. 11B, green pixels G are disposed at the left, right, top, and bottom directions of the red pixel R corresponding to the third region 133. In addition, the blue pixels B are disposed in two diagonal directions crossing each other. Therefore, in order to obtain the same optical effect as the green light among the transmitted light that has passed through the third region 133 travels in the left, right, to, and bottom directions of the third region 133, and the blue light among the transmitted light that has passed through the third region 133 travels in the diagonal direction of the third region 133, the third pattern of the third region 133 may have four-fold symmetry.

For example, as shown in FIG. 11A, the third pattern of the third region 133 may be symmetric about a first axis I in the Y-direction, about a second axis II in the X-direction, and about a third axis III and a fourth axis IV in the diagonal direction.

Figure 12A:
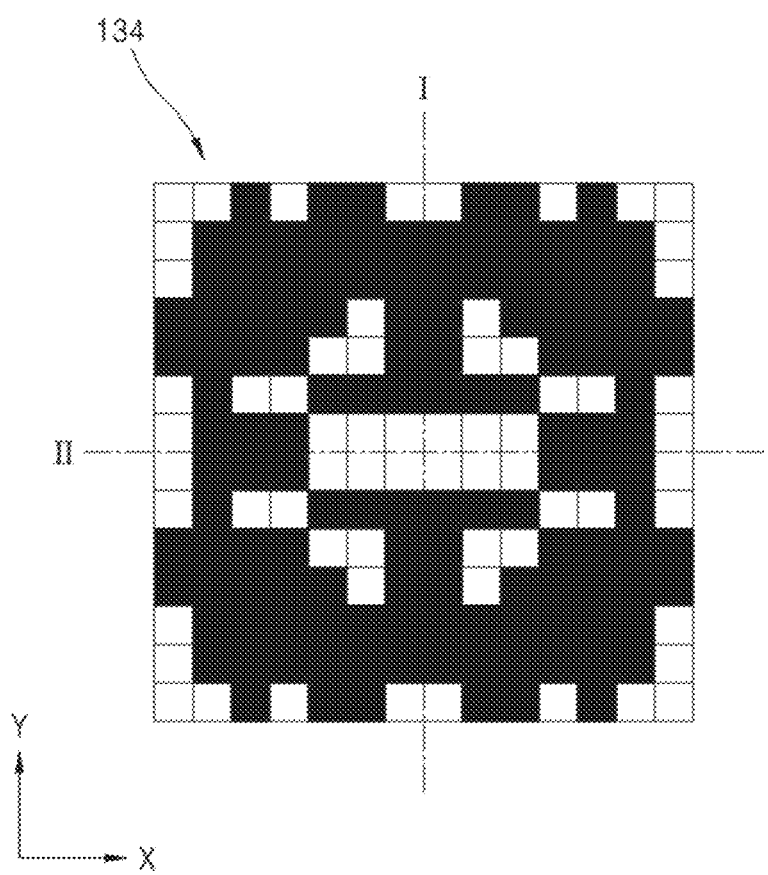
FIG. 12A is a diagram showing a fourth region in the unit pattern array of FIG. 4.
Figure 12B:
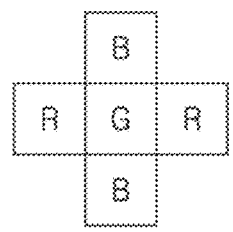
FIG. 12B is a diagram showing a pixel and peripheral pixels in an image sensor, wherein the pixel corresponds to the fourth region according to an example embodiment.

FIG. 12A shows a shape of the fourth region 134 in the unit pattern array of FIG. 4, and FIG. 12B shows a pixel, which corresponds to the fourth region 134, and peripheral pixels in the image sensor.

Referring to FIG. 12B, the red pixels R are disposed at the left and right sides of the green pixel G corresponding to the fourth region 134 and the blue pixels B are disposed at the top and bottom sides of the green pixel G.

Green pixels corresponding to the first region 131 are disposed at the diagonal direction. Therefore, in order to obtain the same optical effect as the red light among the transmitted light that has passed through the fourth region 134 travels in the left and right directions of the fourth region 134, and the blue light among the transmitted light that has passed through the fourth region 134 travels in the top and bottom directions of the fourth region 134, the fourth pattern of the fourth region 134 may have two-fold symmetry.

For example, as shown in FIG. 12A, the fourth pattern of the fourth region 134 may be symmetric about a first axis I in the Y-direction and symmetric about a second axis II in the X-direction. Also, the pixel arrangement shown in FIG. 12B is the same as the pixel arrangement rotated by 90 degrees from a state shown in FIG. 9B. Accordingly, the fourth pattern of the fourth region 134 may have the same shape as the pattern of the first region 131 in a state where the first pattern is rotated by 90 degrees.

In the color separating lens array 130 applied to the Bayer pattern type image sensor, as another example rule of the first to fourth patterns of the first to fourth regions 131, 132, 133, and 134, the first to fourth patterns of the first to fourth regions 131, 132, 133, and 134 may be designed such that the blue light, green light, and red light transmitted through the color separating lens array 130 have a predetermined target phase distribution. For example, the first to fourth patterns of the first to fourth regions 131, 132, 133 and 134 may be determined such that a phase making the blue light transmitted through the color separating lens array 130 be condensed to a position of the blue pixel B corresponding to the second region 132 and not travel to positions corresponding to the first region 131 and the fourth region 134 adjacent to the second region 132 is formed.

In addition, the first to fourth patterns of the first to fourth regions 131, 132, 133 and 134 may be determined such that a phase making the green light transmitted through the color separating lens array 130 be condensed to positions of the green pixel G corresponding to the first region 131 and the fourth region 134 and not travel to positions corresponding to the second region 132 and third region 133 adjacent to the first region 131 and the fourth region 134 is formed. In addition, the first to fourth patterns of the first to fourth regions 131, 132, 133 and 134 may be determined such that a phase making the red light transmitted through the color separating lens array 130 be condensed to a position of the red pixel R corresponding to the third region 133 and not travel to positions corresponding to the first region 131 and the fourth region 134 adjacent to the third region 133 is formed. For example, the target phase distribution to be implemented by the color separating lens array 130 may be a distribution in which the phase of the blue light at a position through the color separating lens array 130 is 2Mπ in the center of the second region 132 corresponding to the second photo-sensing cell 112, is (2M−1)π in the center of the first region 131 corresponding to the first photo-sensing cell 111 and in the center of the fourth region 134 corresponding to the fourth photo-sensing cell 114, and is greater than (2M−2)π and less than (2M−1)π in the center of the third region 133 corresponding to the third photo-sensing cell 113. Here, M is an integer greater than 0. For example, the phase of blue light at the position immediately after passing through the color separating lens array 130 may become maximum in the center of the second region 132, and may gradually decrease in a concentric circle shape as the distance from the center of the second region 132 gets smaller, and may become locally minimized at the center of the third region 133.

For example, in the case of M=1, the phase of the blue light at a position through the color separating lens array 130 may be 2π in the center of the second region 132, π in the center of the first region 131 and the center of the fourth region 134, and about 0.2π to about 0.7π in the center of the third region 133.

In addition, the phase of the green light at a position through the color separating lens array 130 may be 2Nπ in the center of the first region 131 corresponding to the first photo-sensing cell 111 and the center of the fourth region 134 corresponding to the fourth photo-sensing cell 114, and (2N−1)π in the center of the second region 132 corresponding to the second photo-sensing cell 112 and the center of the third region 133 corresponding to the third photo-sensing cell 113. Here, N is an integer greater than 0. For example, the phase of green light at the position immediately after passing through the color separating lens array 130 may be maximum in the center of the first region 131 and the center of the fourth region 134, and may gradually decrease in a concentric circle shape as the distance from the center of the first region 131 and the center of the fourth region 134 gets smaller, and may be minimized at the center of the second region 132 and the center of the third region 133. For example, in the case of N=1, the phase of green light at a location through the color separating lens array 130 may be 2π in the center of the first region 131 and the center of the fourth region 134, and π in the center of the second region 132 and the center of third region 133.

In addition, the phase of red light at the position through the color separating lens array 130 may be 2Lπ in the center of the third region 133 corresponding to the third photo-sensing cell 113, (2L−1)π in the center of the first region 131 corresponding to the first photo-sensing cell 111 and in the center of the fourth region 134 corresponding to the fourth photo-sensing cell 114, and greater than (2L−2)π and less than (2L−1)π in the center of the second region 132 corresponding to the second photo-sensing cell 112. Here, L is an integer greater than 0. For example, the phase of red light at the position immediately after passing through the color separating lens array 130 may become maximum in the center of the third region 133, and may gradually decrease in a concentric circle shape as the distance from the center of the third region 133 gets smaller, and may become locally minimized at the center of the second region 132. For example, in the case of L=1, the phase of the red light at a position through the color separating lens array 130 may be 2π in the center of the third region 133, π in the center of the first region 131 and the center of the fourth region 134, and about 0.2π to about 0.7π in the center of the second region 132. As mentioned above, the target phase distribution refers to the position immediately after passing through the color separating lens array 130, that is, the phase distribution of light on the lower surface of the color separating lens array 130 or the upper surface of the spacer layer 120. When light passing through the color separating lens array 130 has such a phase distribution, lights of the first wavelength to the fourth wavelength are collected in the corresponding first to fourth photo-sensing cells 111, 112, 113, and 114, respectively. For example, it is possible to obtain an optical effect that the light transmitted through the color separating lens array 130 is branched according to wavelength and travels in different directions to be condensed.

Figure 13A:
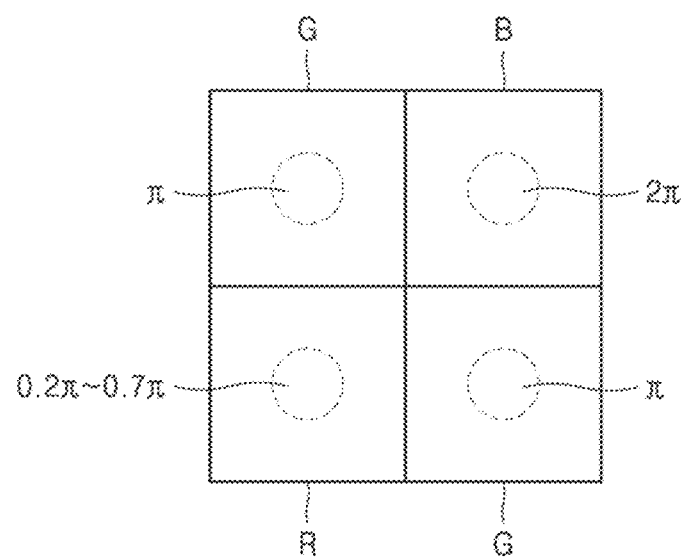

In this way, a predetermined propagation distance requirement may be determined in order to condense light of a corresponding wavelength to the corresponding photo-sensing cell, and accordingly, a thickness h of the spacer layer 120 may be determined. The thickness h of the spacer layer 120 may vary depending on a wavelength λ of the light to be branched, a pixel size, and an arrangement period p of the photo-sensing cells. The thickness h of the spacer layer 120 may be greater than the center wavelength λ of the visible light wavelength band to be branched, and compared with the arrangement period p of the photo-sensing cells, which is the distance between the centers of adjacent photo-sensing cells, may be within a range of about 1p to about 3p. For example, the thickness h of the spacer layer 120 may be within a range of about 500 nm to about 5 μm. Further details for setting the thickness h of the spacer layer 120 will be described later with reference to FIGS. 16A to 16E, 17A to 17E, and 18A to 18E. FIGS. 13A and 13B are diagrams that simulate a phase distribution of blue light passing through the color separating lens array and a focusing distribution of blue light in an facing photo-sensing cell according to an example embodiment, FIG. 13C is a diagram showing a direction of blue light incident on and around the second region of the color separating lens array corresponding to a blue pixel B according to an example embodiment, and FIG. 13D is a diagram showing a micro lens array that acts equivalently to the color separating lens array for blue light according to an example embodiment.

According to the phase distribution illustrated in FIG. 13A, a phase at the center of a region corresponding to blue pixel B is approximately 2π, a phase at the center of a region corresponding to adjacent green pixel G is approximately π, and a phase in the center of a region corresponding to the red pixel R in the diagonal direction represents a value approximately smaller than π, for example, about 0.2π to about 0.7π. The above phase distribution may represent a focusing distribution of the blue light as shown in FIG. 13B. The blue light is mostly focused on the region corresponding to the blue pixel B, and rarely reaches the regions corresponding to the other pixels.

Figure 13C:
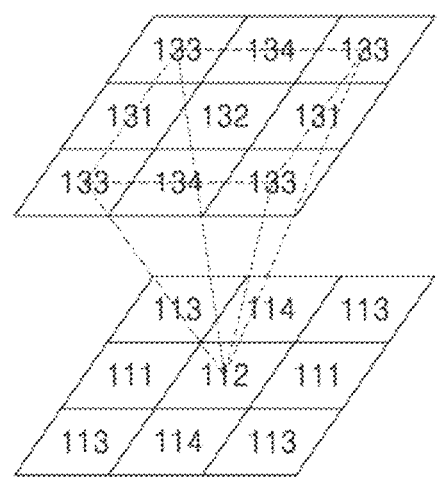
FIG. 13C is a diagram showing a direction of blue light incident on and around the second region of the color separating lens array corresponding to a blue pixel according to an example embodiment.
Figure 13D:
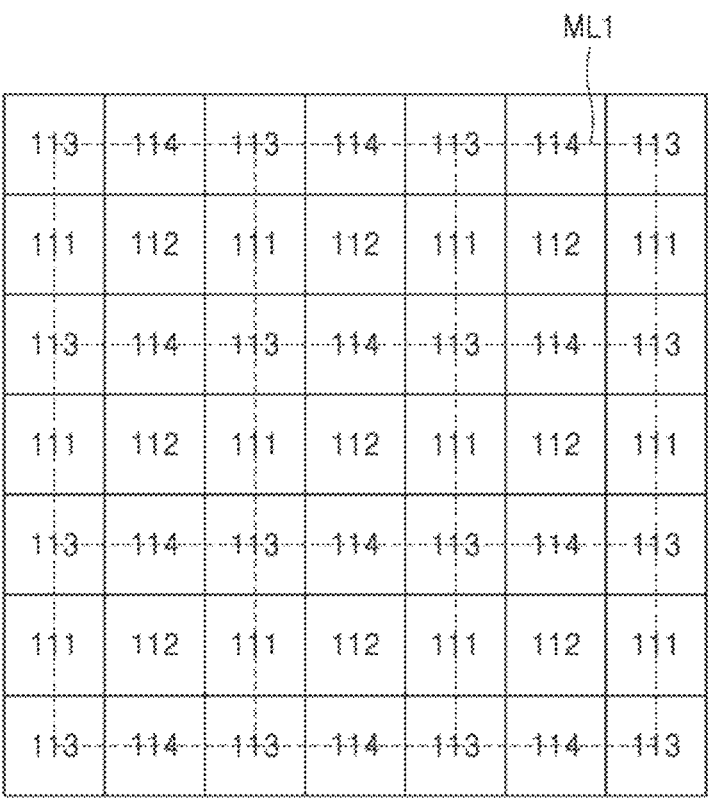
FIG. 13D is a diagram showing a micro lens array that acts equivalently to the color separating lens array for blue light according to an example embodiment.

As a result, the blue light incident on and around the second region 132 corresponding to the blue pixel B passes through the color separating lens array 130 and then travels as shown in FIG. 13C. For example, among the incident light incident on the second region 132 of the color separating lens array 130 and some of the other regions surrounding the second region 132, the blue light is condensed in the center of the second photo-sensing cell 112 directly under the second region 132. For example, blue light from the second region 132 corresponding to the blue pixel B, blue light from two first regions 131 adjacent to the second region 132 in a transverse direction, blue light from two fourth regions 134 adjacent to the second region 132 in a longitudinal direction, and blue light from four third regions 133 adjacent to the second region 132 in a diagonal direction are incident on one blue pixel B. Accordingly, as illustrated in FIG. 13D, the color separating lens array 130 may function equivalent to a plurality of microlens ML1 arrays disposed around the second photo-sensing cell 112 for blue light. Because each equivalent microlens ML1 is larger than the corresponding second photo-sensing cell 112, the blue light incident on a region of the second photo-sensing cell 112 as well as blue light incident on another region surrounding the second photo-sensing cell 112 may be condensed onto the second photo-sensing cell 112. For example, each microlens ML1 may be about 4 times larger than the corresponding second photo-sensing cell 112, and the four sides of each microlens ML1 may be parallel to the four sides of the second photo-sensing cell 112.

Figure 14A:
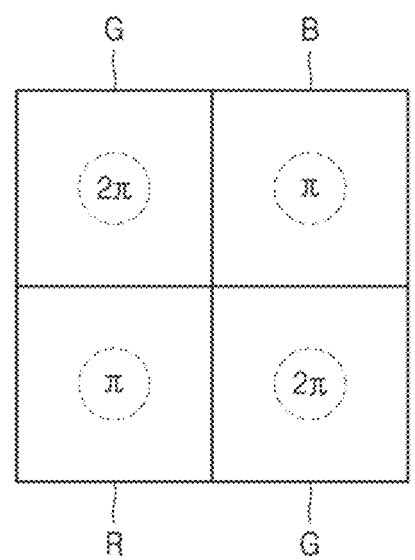
FIGS. 14A and 14B are diagrams that simulate a phase distribution of green light passing through the color separating lens array and a focusing distribution of green light in an facing photo-sensing cell according to an example embodiment.
Figure 14B:
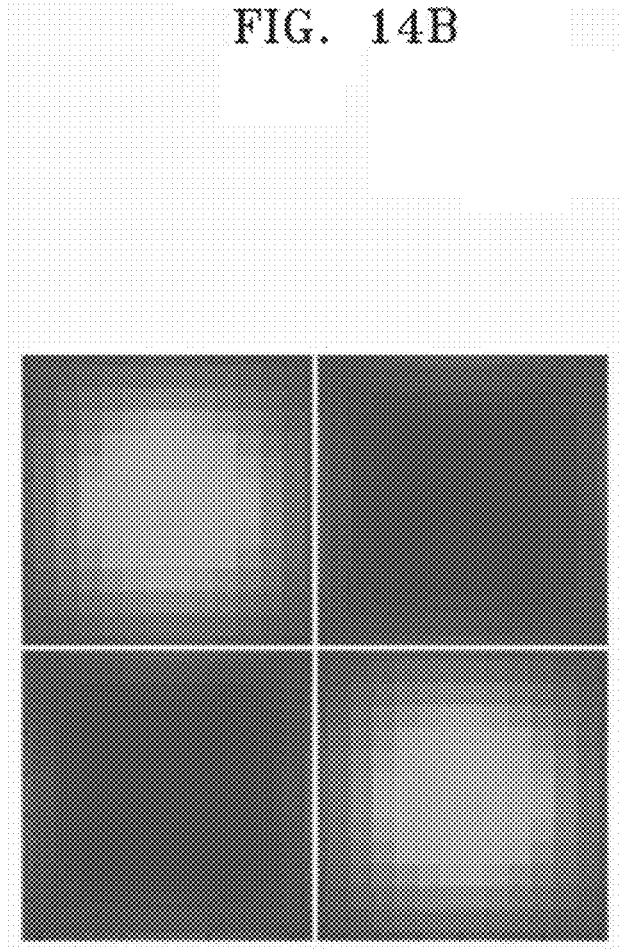
Figure 14C:
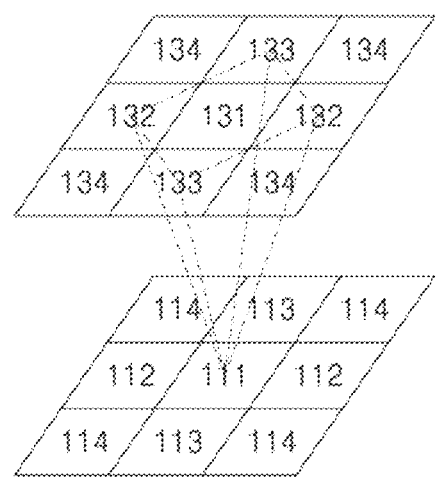
FIG. 14C is a diagram showing a direction of green light incident on and around the first region of the color separating lens array corresponding to a green pixel according to an example embodiment.
Figure 14D:
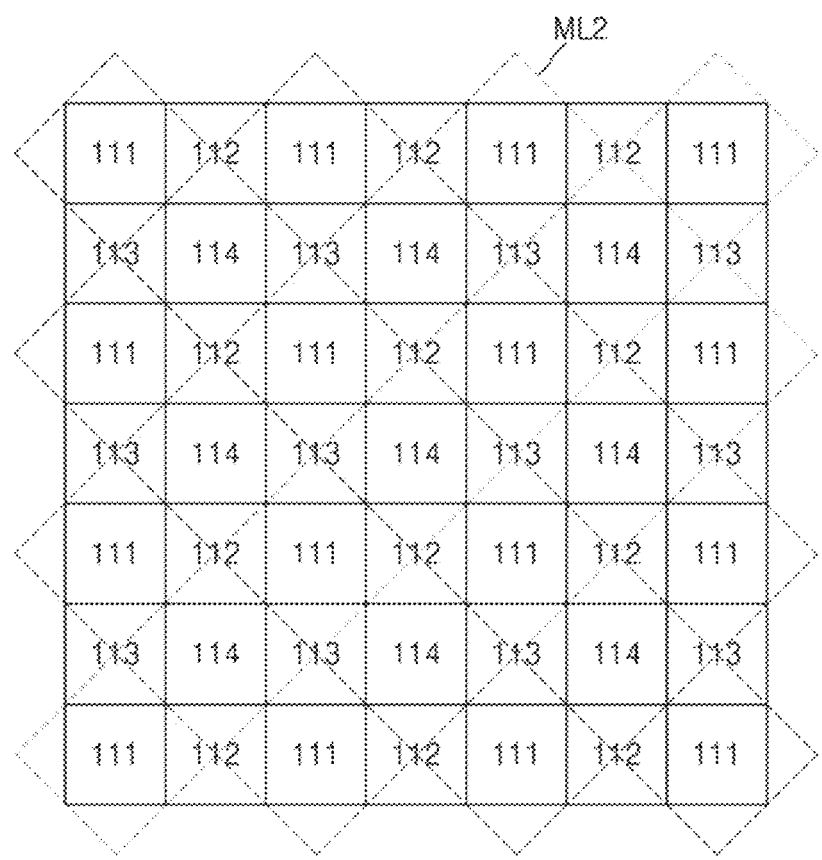
FIG. 14D is a diagram showing a micro lens array that acts equivalently to the color separating lens array for green light according to an example embodiment.

FIGS. 14A and 14B are diagrams that simulate a phase distribution of green light passing through the color separating lens array and a focusing distribution of green light in an facing photo-sensing cell according to an example embodiment, FIG. 14C is a diagram showing a direction of green light incident on and around the first region and the fourth region of the color separating lens array corresponding to a green pixel according to an example embodiment, and FIG. 14D is a diagram showing a micro lens array that acts equivalently to the color separating lens array for green light according to an example embodiment. According to the phase distribution exemplarily shown in FIG. 14A, the phase at the center of the region corresponding to the green pixel G is about $2\pi$, and the phase at the centers of the regions corresponding to the blue pixel B and the red pixel R adjacent to the green pixel G represents a value of about $\pi$. The above phase distribution may represent a focusing distribution of the green light as shown in FIG. 14B.

The green light is branched to be condensed on regions corresponding to two green pixels G, and rarely reaches the regions corresponding to the other pixels.

As a result, the green light incident on and around the first and fourth regions 131 and 134 corresponding to the green pixel G passes through the color separating lens array 130 and then travels as shown in FIG. 14C.

For example, among the incident light incident on the first region 131 of the color separating lens array 130 and some of the other regions surrounding the first region 131, the green light is condensed in the center of the first photo-sensing cell 111 directly under the first region 131. Among the incident light incident on the fourth region 134 of the color separating lens array 130 and some of the other regions surrounding the fourth region 134, the green light is condensed in the center of the fourth photo-sensing cell 114 directly under the fourth region 134.

For example, green light from the first region 131 or fourth region 134 corresponding to the green pixel G and green light from two second regions 132 and two third regions 133 adjacent to the first region 131 or fourth region 134 in the transverse direction and longitudinal direction are incident one green pixel G. Accordingly, as illustrated in FIG. 14D, the color separating lens array 130 may function equivalent to a plurality of microlens ML2 arrays disposed around the first photo-sensing cell 111 and the fourth photo-sensing cell 114 for green light. Because each equivalent microlens ML2 is larger than the corresponding first photo-sensing cell 111 or fourth photo-sensing cell 114, the green light incident on regions of the first photo-sensing cell 111 and fourth photo-sensing cell 114 as well as green light incident on another region surrounding the first photo-sensing cell 111 and the fourth photo-sensing cell 114 may be condensed onto the first photo-sensing cell 111 and the fourth photo-sensing cell 114. For example, each micro lens ML2 may be about twice as large as the corresponding first photo-sensing cell 111 or fourth photo-sensing cell 114, and may be disposed to contact with respect to the corresponding first photo-sensing cell 111 and fourth photo-sensing cell 114 in a diagonal direction.

Figure 15A:
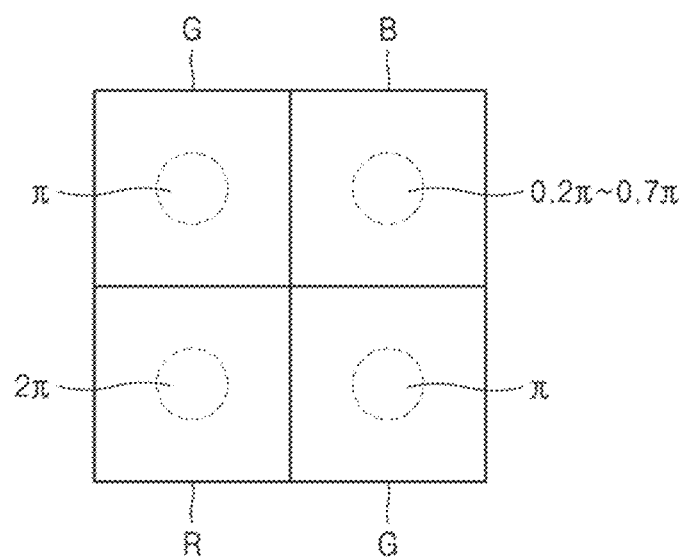
FIGS. 15A and 15B are diagrams that simulate a phase distribution of red light passing through the color separating lens array and a focusing distribution of red light in an facing photo-sensing cell according to an example embodiment.
Figure 15B:
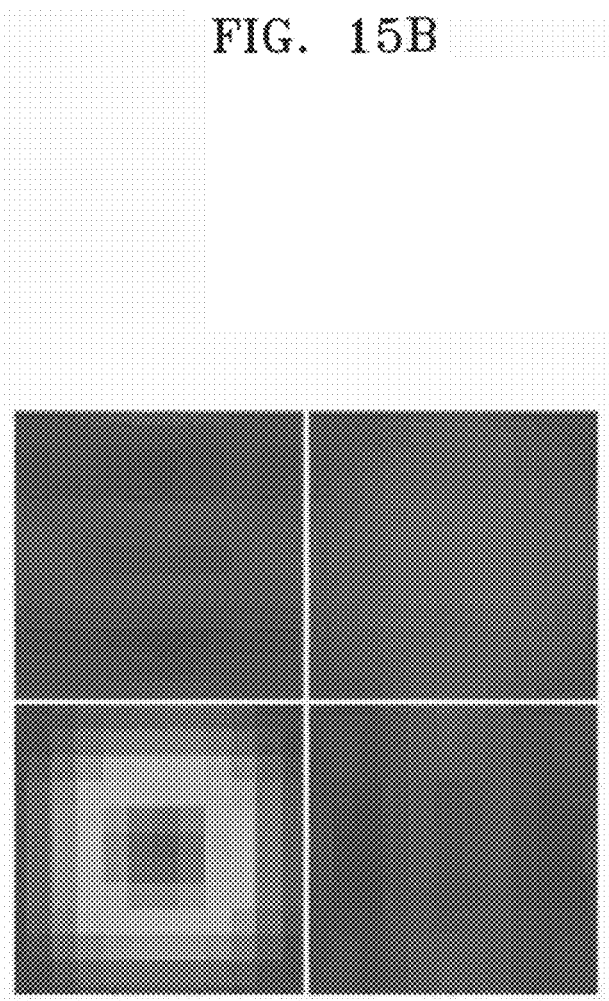
Figure 15C:
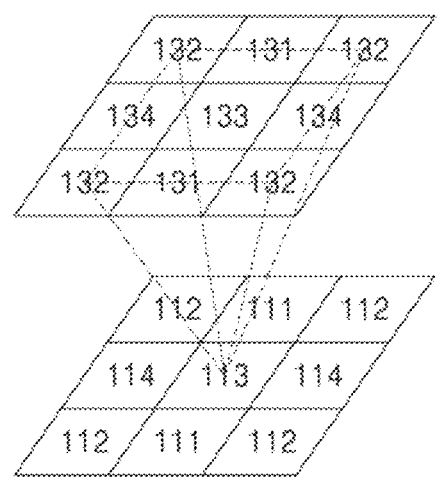
FIG. 15C is a diagram showing a direction of red light incident on and around the third region of the color separating lens array corresponding to a red pixel according to an example embodiment.
Figure 15D:
FIG. 15D is a diagram showing a micro lens array that acts equivalently to the color separating lens array for red light according to an example embodiment.

FIGS. 15A and 15B are diagrams that simulate a phase distribution of red light passing through the color separating lens array and a focusing distribution of red light in an facing photo-sensing cell according to an example embodiment, FIG. 15C is a diagram showing a direction of red light incident on and around the third region of the color separating lens array corresponding to a red pixel according to an example embodiment, and FIG. 15D is a diagram showing a micro lens array that acts equivalently to the color separating lens array for red pixel R according to an example embodiment. According to the phase distribution illustrated in FIG. 15A, a phase at the center of a region corresponding to red pixel R is approximately $2\pi$, a phase at the center of a region corresponding to adjacent green pixel G is approximately $\pi$, and a phase in the center of a region corresponding to the blue pixel B in the diagonal direction represents a value approximately smaller than $\pi$, for example, about $0.2\pi$ to about $0.7\pi$.

The above phase distribution may represent a focusing distribution of the red light as shown in FIG. 15B. The red light is condensed on the region corresponding to the red pixel R and rarely reaches the regions corresponding to the other pixels. As a result, the light incident on and around the third region 133 corresponding to the red pixel R passes through the color separating lens array 130 and then travels as shown in FIG. 15C. For example, among the incident light incident on the third region 133 of the color separating lens array 130 and some of the other regions surrounding the third region 133, the red light is condensed in the center of the third photo-sensing cell 113 directly under the third region 133.

For example, red light from the third region 133 corresponding to the red pixel R, red light from two fourth regions 134 adjacent to the third region 133 in a transverse direction, red light from two first regions 131 adjacent to the third region 133 in a longitudinal direction, and red light from four second regions 132 adjacent to the third region 133 in a diagonal direction are incident on one red pixel R. Accordingly, as illustrated in FIG. 15D, the color separating lens array 130 may function equivalent to a plurality of microlens ML3 arrays disposed around the third photo-sensing cell 113 for red light. Because each equivalent microlens ML3 is larger than the corresponding third photo-sensing cell 113, the red light incident on a region of the third photo-sensing cell 113 as well as red light incident on another region surrounding the third photo-sensing cell 113 may be condensed onto the third photo-sensing cell 113. For example, each microlens ML3 may be about 4 times larger than the corresponding third photo-sensing cell 113, and the four sides of each microlens ML3 may be parallel to the four sides of the third photo-sensing cell 113.

As shown in FIGS. 13C, 13D, 14C, 14D, 15C, and 15D, among the incident light incident on the first region 131 of the color separating lens array 130, the green light travels toward the center of the first photo-sensing cell 111 corresponding to the first region 131, the blue light travels toward the center of the second photo-sensing cell 112 around the first photo-sensing cell 111 corresponding to the first region 131, and the red light travels toward the center of the third photo-sensing cell 113 around the first photo-sensing cell 111 corresponding to the first region 131. In addition, among the incident light incident on the second region 132 of the color separating lens array 130, the blue light travels toward the center of the second photo-sensing cell 112 corresponding to the second region 132, the green light travels toward the centers of the first photo-sensing cell 111 and the fourth photo-sensing cell 114 around the second photo-sensing cell 112 corresponding to the second region 132, and the red light travels toward the center of the third photo-sensing cell 113 around the second photo-sensing cell 112 corresponding to the second region 132.

Similarly, among the incident light incident on the third region 133 of the color separating lens array 130, the red light travels toward the center of the third photo-sensing cell 113 corresponding to the third region 133, the green light travels toward the center of the first photo-sensing cell 111 and the fourth photo-sensing cell 114 around the third photo-sensing cell 113 corresponding to the third region 133, and the blue light travels toward the center of the second photo-sensing cell 112 around the third photo-sensing cell 113 corresponding to the third region 133. Finally, among the incident lights incident on the fourth region 134 of the color separating lens array 130, the green light travels toward the center of the fourth photo-sensing cell 114 corresponding to the fourth region 134, the blue light travels toward the center of the second photo-sensing cell 112 around the fourth photo-sensing cell 114 corresponding to the fourth region 134, and the red light travels toward the center of the third photo-sensing cell 113 around the fourth photo-sensing cell 114 corresponding to the fourth region 134. The above described color separation and condensing of light may be achieved more effectively by properly setting the thickness of the spacer layer 120.

For example, when a theoretical thickness of the spacer layer 120 is $h_t$ and a refractive index of the spacer layer 120 with respect to a wavelength of $\lambda_0$ is n, and a pitch of the photo-sensing cells is p, the following equation 1 may be satisfied.

[Equation 1]

$$h_t = \frac{np^2}{\lambda_0} - \frac{\lambda_0}{4\pi}$$ [Equation 1]

Here, the theoretical thickness $h_t$ of the spacer layer 120 may mean the focal length at which light having a wavelength of $\lambda_0$ is condensed on the upper surface of the photo-sensing cell 111, 112, 113, and 114 by the color separating lens array 130.

For example, the light having the wavelength of $\lambda_0$ may be focused at a distance $h_t$ from a lower surface of the color separating lens array 130 while passing through the color separating lens array 130. As described in Equation 1 above, the theoretical thickness $h_t$ of the spacer layer 120 may vary according to the pitch p of the photo-sensing cells 111, 112, 113, and 114 and the refractive index n of the spacer layer 120.

For example, when the center wavelength $\lambda_0$ of the visible light band is 540 nm, the pitch p of the photo-sensing cells 111, 112, 113, and 114 is 0.8 µm, and the refractive index n of the spacer layer 120 at a wavelength of 540 nm is 1.46, the theoretical thickness $h_t$ of the spacer layer 120, that is, the distance between the lower surface of the color separating lens array 130 and the upper surface of the sensor substrate 110 may be about 1.64 µm. However, the actual thickness of the spacer layer 120 need not be limited only to the theoretical thickness $h_t$ described in Equation 1. For example, the actual thickness of the spacer layer 120 may be selected within a predetermined range based on the theoretical thickness $h_t$ of Equation 1 considering the efficiency of the color separating lens array 130.

Figure 16A:
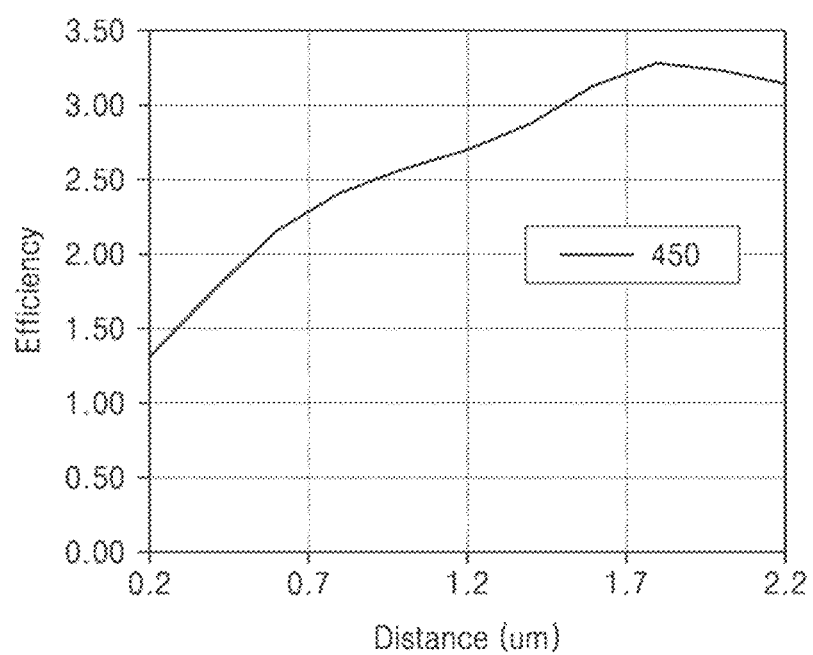
FIGS. 16A, 16B, 16C, 16D, and 16E are graphs showing an efficiency variation of a color separating lens array according to a distance between the color separating lens array and a sensor substrate, according to an example embodiment in which a pitch of photo-sensing cells is 0.7 μm.
Figure 16B:
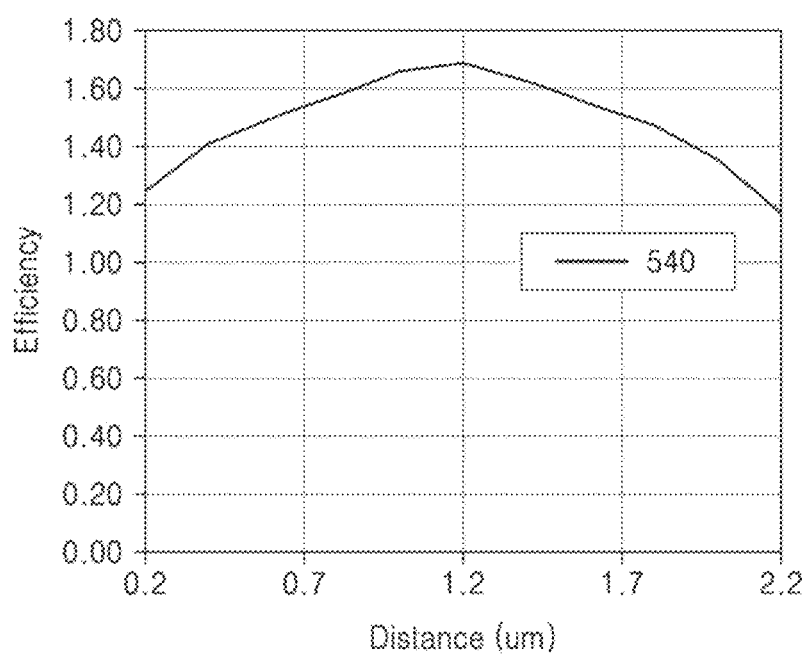
Figure 16C:
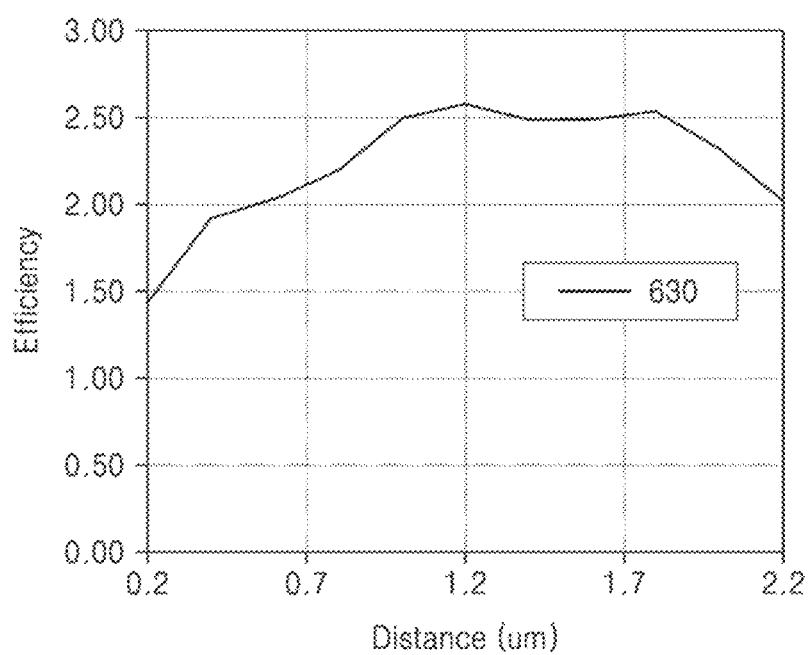

FIGS. 16A to 16E are graphs showing variation the efficiency of the color separating lens array 130 according to the distance between the color separating lens array 130 and the sensor substrate 110 when the pitch of the photo-sensing cells 111, 112, 113, and 114 is 0.7 µm according to an example embodiment. FIG. 16A shows a condensing efficiency of the color separating lens array 130 for the blue light incident on the second photo-sensing cell 112 from first to fourth regions 131, 132, 133, and 134 constituting the unit pattern array of color separating lens array 130 according to an example embodiment, FIG. 16B shows a condensing efficiency of the color separating lens array 130 for the green light incident on the first photo-sensing cell 111 and the fourth photo-sensing cell 114 from the first to fourth regions 131, 132, 133, and 134 constituting the unit pattern array according to an example embodiment, and FIG. 16C shows the condensing efficiency of the color separating lens array 130 for the red light incident on the third photo-sensing cell 113 from the first to fourth regions 131, 132, 133, and 134 constituting the unit pattern array according to an example embodiment. In the case of FIGS. 16A and 16C, because four regions are disposed for one photo-sensing cell, the theoretical maximum value is 4. In the case of FIG. 16B, because four regions are disposed for two photo-sensing cells, the theoretical maximum value is 2. In the graphs of FIGS. 16A to 16C, the distance at which the condensing efficiency of the color separating lens array 130 is the highest is the theoretical thickness $h_t$ satisfying Equation 1.

Figure 16D:
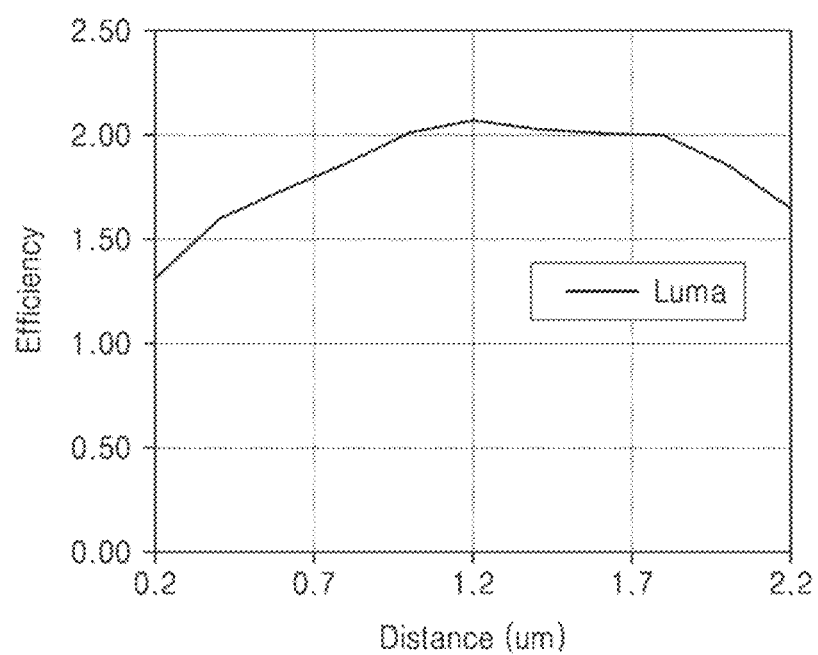

As shown in FIGS. 16A to 16C, the theoretical thickness $h_t$ varies slightly depending on the wavelength. FIG. 16D is a graph showing the variation in the efficiency of the color separating lens array taking into account sensitivity characteristics of human eye with respect to the visible light. For example, eyes of a human being generally have the highest sensitivity with respect to the green light and the lowest sensitivity with respect to the blue light.

Figure 16E:
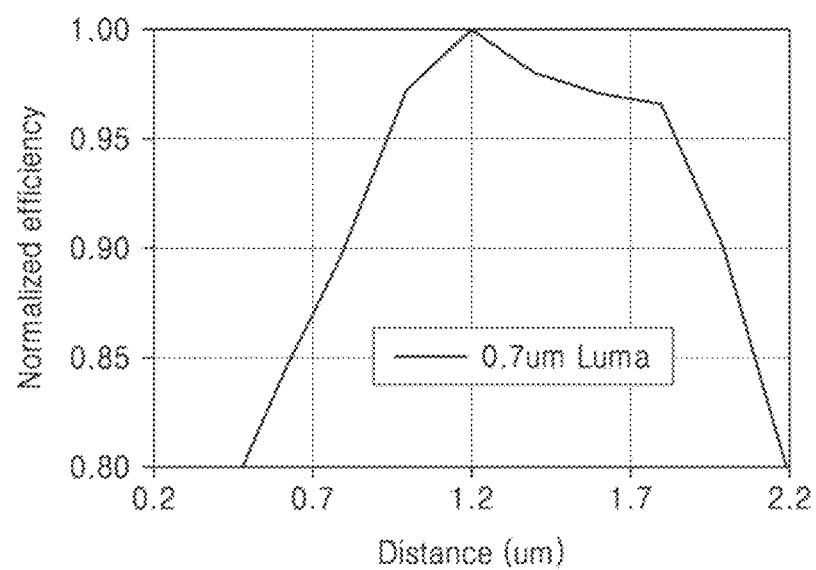

Therefore, the graph of FIG. 16D may be obtained by assigning the lowest weight to the graph of FIG. 16A, giving the graph of FIG. 16C a higher weight than the blue light, assigning the highest weight to FIG. 16B, summing the weighted values, and averaging the summed values FIG. 16E is a graph showing a result of normalizing the graph shown in FIG. 16D. Referring to FIGS. 16D and 16E, the efficiency of the color separating lens array 130 with respect to the visible light taking into account the sensitivity characteristic of human eyes is the highest at the distance of about 1.2 µm when the pitch of the photo-sensing cells 111, 112, 113, and 114 is 0.7 µm. Also, the efficiency of the color separating lens array 130 is about 80% of the maximum efficiency at the distance of about 0.5 µm and is about 95% of the maximum efficiency at the distance of about 1.9 µm.

Figure 17A:
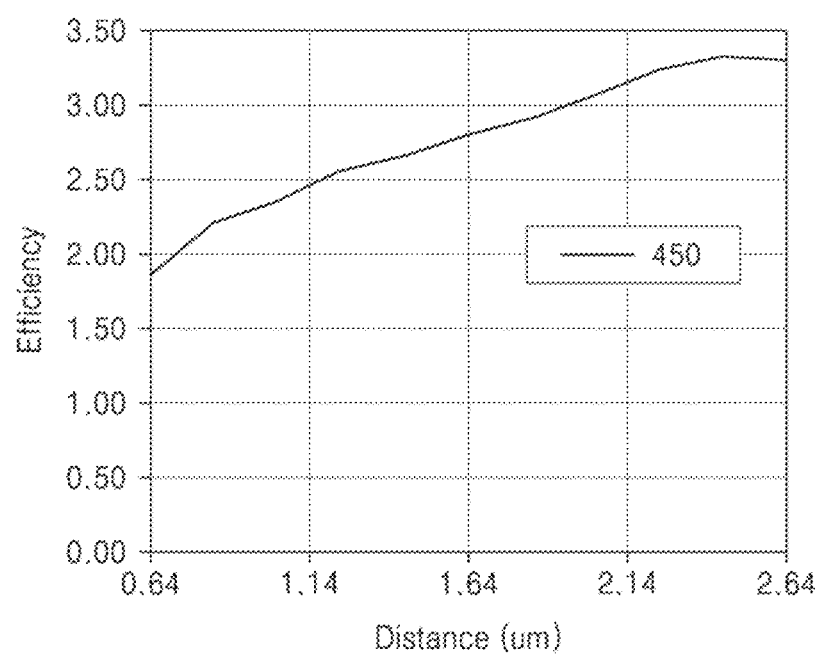
FIGS. 17A, 17B, 17C, 17D, and 17E are graphs showing an efficiency variation of a color separating lens array according to a distance between the color separating lens array and a sensor substrate, according to an example embodiment in which a pitch of photo-sensing cells is 0.8 μm.
Figure 17B:
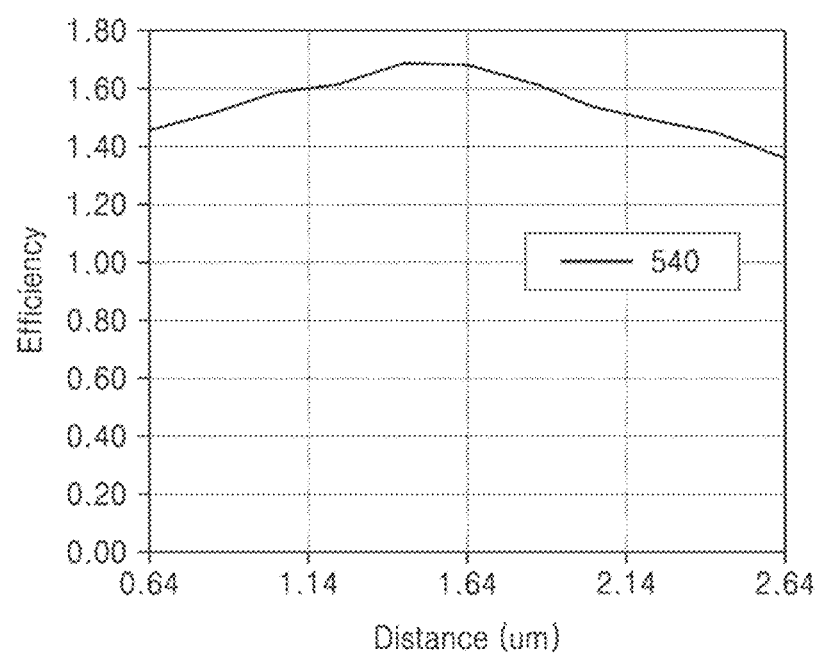
Figure 17C:
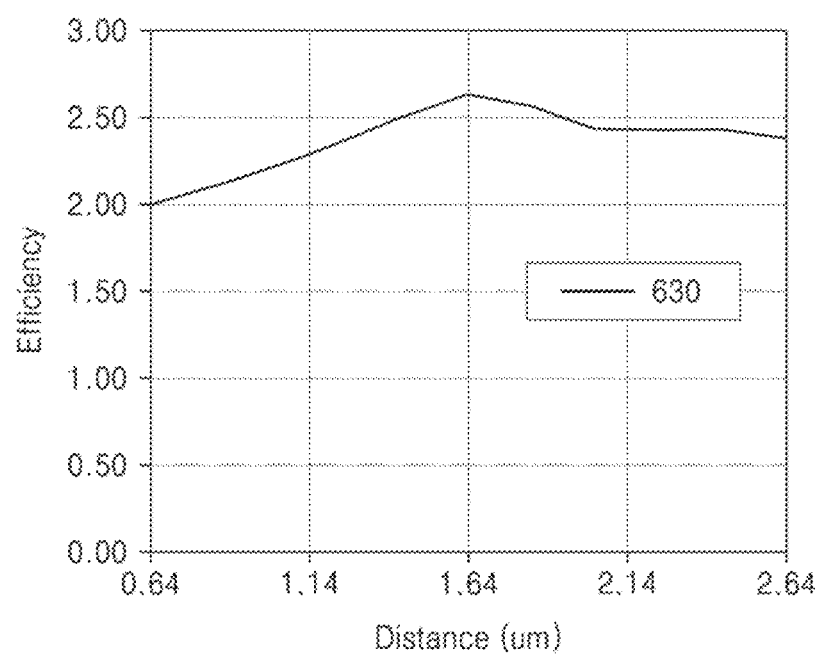
Figure 17D:
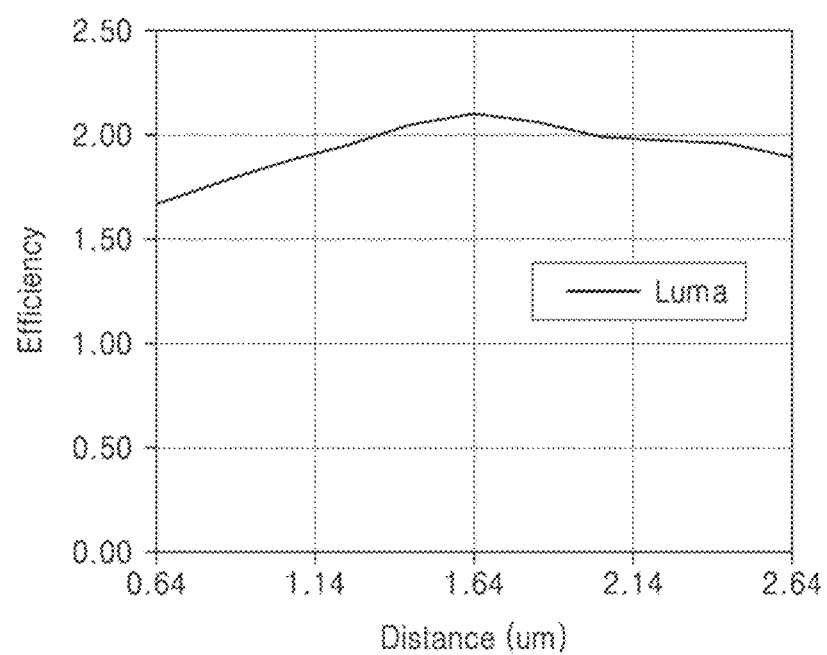
Figure 17E:
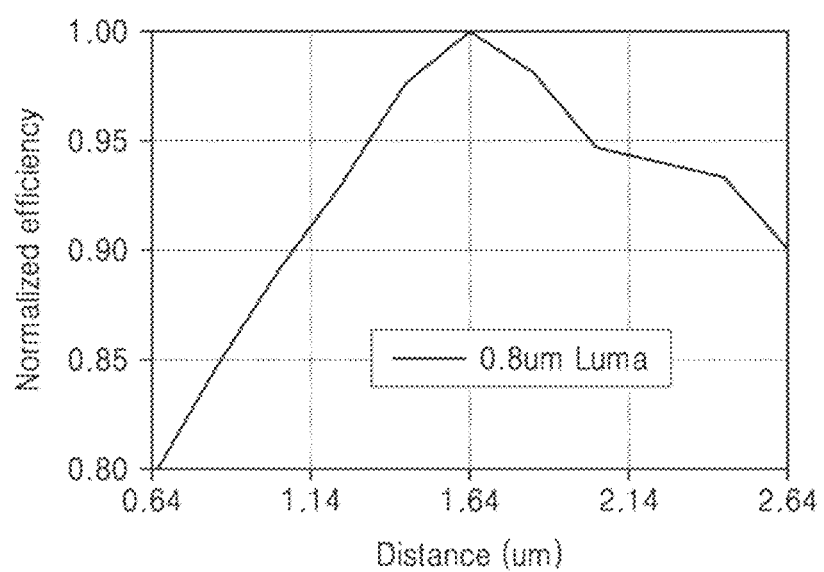

FIGS. 17A to 17E are graphs showing variation the efficiency of the color separating lens array 130 according to the distance between the color separating lens array 130 and the sensor substrate 110 when the pitch of the photo-sensing cells 111, 112, 113, and 114 is 0.8 µm according to an example embodiment. Referring to FIGS. 17A and 17E, the efficiency of the color separating lens array 130 with respect to the visible light taking into account the sensitivity characteristic of human eyes is the highest at the distance of about 1.64 µm when the pitch of the photo-sensing cells 111, 112, 113, and 114 is 0.8 µm.

Also, the efficiency of the color separating lens array 130 is about 85% of the maximum efficiency at the distance of about 0.8 μm and is about 93% of the maximum efficiency at the distance of about 2.5 μm. FIGS. 18A to 18E are graphs showing variation the efficiency of the color separating lens array 130 according to the distance between the color separating lens array 130 and the sensor substrate 110 when the pitch of the photo-sensing cells 111, 112, 113, and 114 is 1.0 μm according to an example embodiment.

Figure 18A:
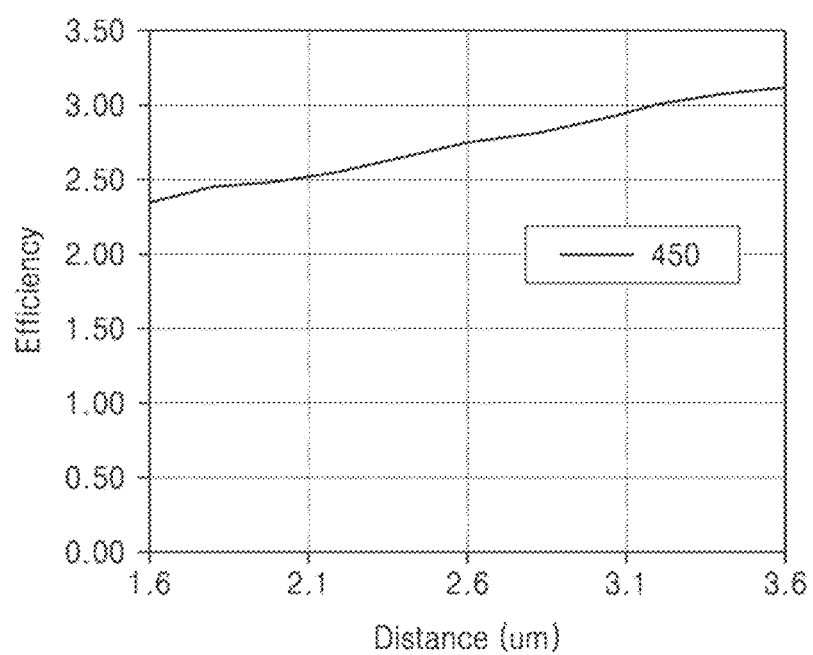
FIGS. 18A, 18B, 18C, 18D, and 18E are graphs showing an efficiency variation of a color separating lens array according to a distance between the color separating lens array and a sensor substrate, according to an example embodiment in which a pitch of photo-sensing cells is 1.0 μm.
Figure 18B:
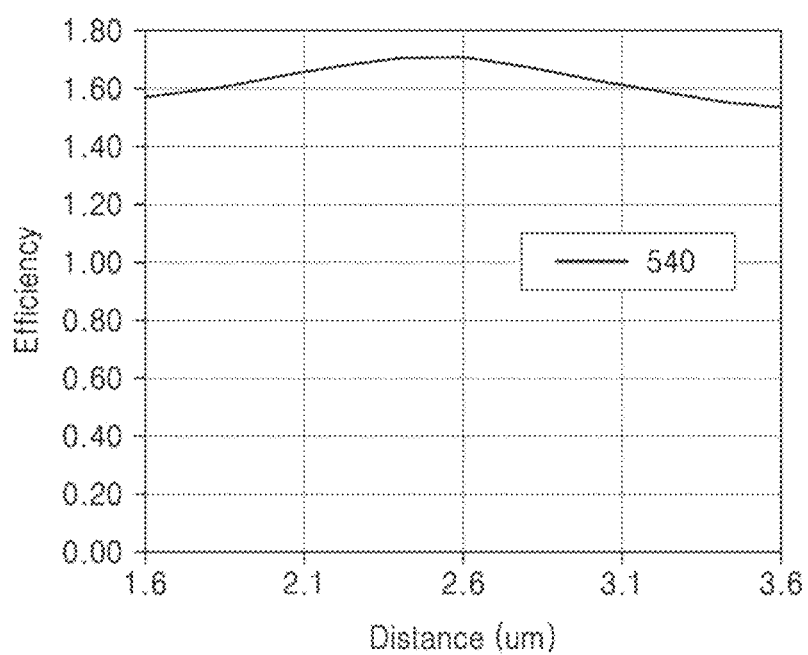
Figure 18C:
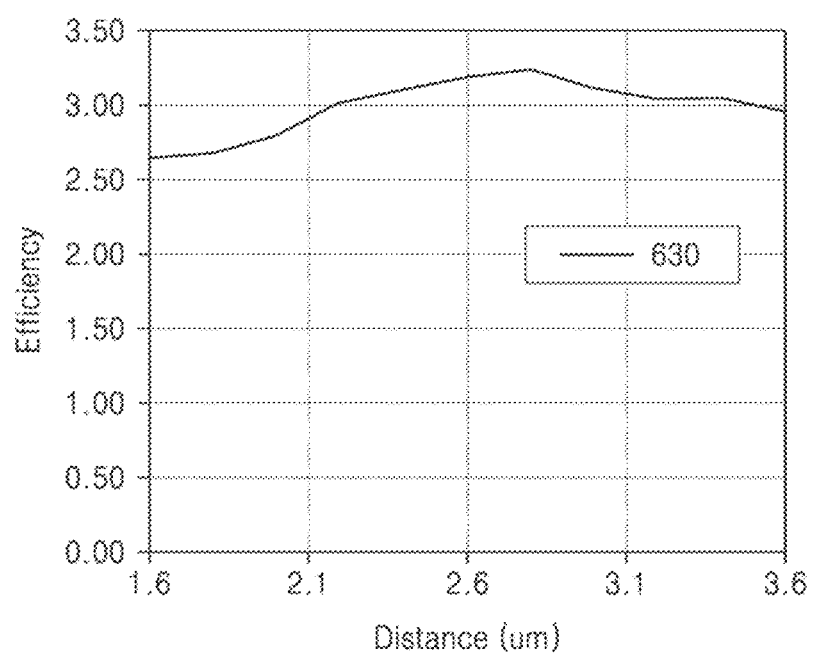
Figure 18D:
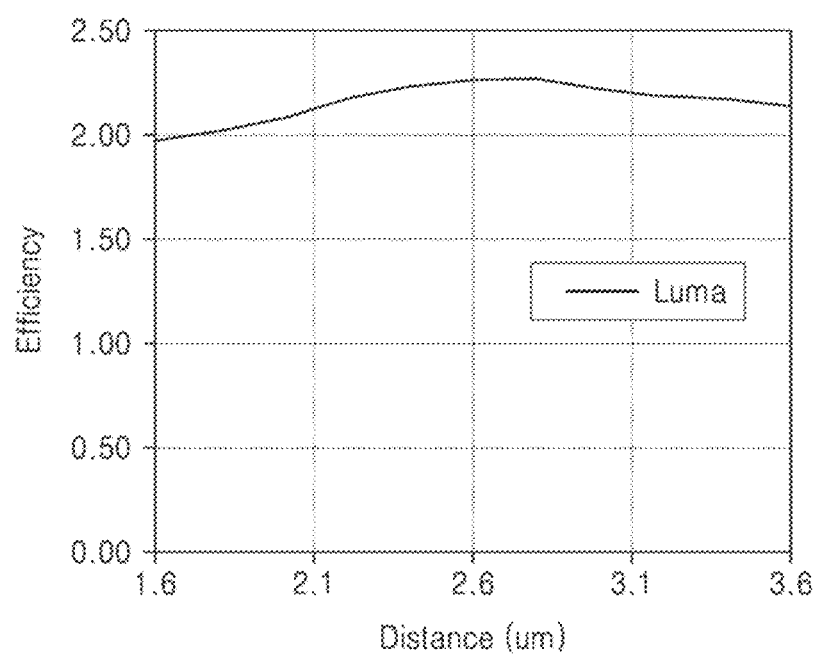
Figure 18E:
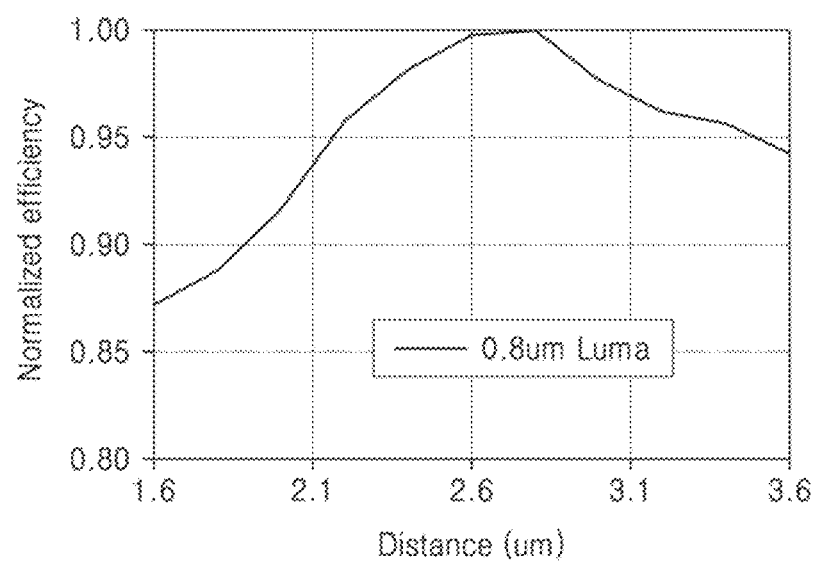

Referring to FIGS. 18A and 18E, the efficiency of the color separating lens array 130 with respect to the visible light taking into account the sensitivity characteristic of human eyes is the highest at the distance of about 2.6 μm when the pitch of the photo-sensing cells 111, 112, 113, and 114 is 1.0 μm. Also, the efficiency of the color separating lens array 130 is about 87% of the maximum efficiency at the distance of about 1.6 μm and is about 94% of the maximum efficiency at the distance of about 3. μm. Based on the above results, even when the thickness h of the spacer layer 220 is greater or less than the theoretical thickness $h_t$ of Equation 1 by the pitch p of the photo-sensing cells 111, 112, 113, and 114, the color separating lens array 130 may have a high efficiency, for example, 80% or greater, 90% or greater, or 95% or greater with respect to the maximum efficiency. In consideration of the above results, the actual thickness h of the spacer layer 120 may be selected within a range of $h_t-p \leq h \leq h_t+p$. Because the color separating lens array 130 described above may branch the incident light by wavelength and condense the branched light on a specific region without absorbing or blocking the incident light, the light utilization efficiency of the image sensor may be improved. Also, since the color separating lens array 130 has an improved color separation performance, the image sensor adopting the color separating lens array 130 may have an improved color purity.

In addition, the image sensor adopting the color separating lens array 130 may implement the Bayer pattern type that is generally adopted in the image sensor, and thus the same image processing algorithm as the existing pixel structure may be used. Moreover, since the color separating lens array 130 may function as a lens for condensing the incident light, the image sensor employing the color separating lens array 130 may not require a separate microlens for condensing the light on each pixel.

Figure 19:
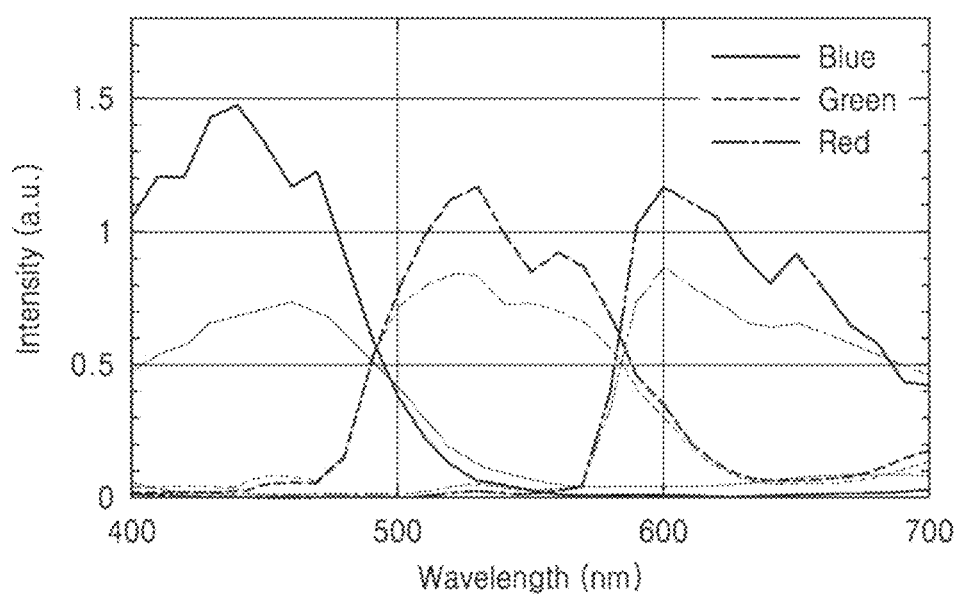
FIG. 19 is a graph showing a spectrum distribution of light incident respectively to a blue pixel, a green pixel, and a red pixel in the image sensor of FIGS. 18A and 18B.

FIG. 19 is a graph showing a spectrum distribution of light incident respectively to a blue pixel, a green pixel, and a red pixel in the image sensor of FIGS. 8A and 8B. The blue pixel may correspond to the second photo-sensing cell 112, the green pixel may correspond to the first photo-sensing cell 111 and the fourth photo-sensing cell 114, and the red pixel may correspond to the third photo-sensing cell 113. In FIG. 19, bold lines show spectrum distributions of the light incident on the blue pixel, the green pixel, and the red pixel when the color separating lens array 130 is used. A bold solid line show a spectrum distribution of the light incident on the blue pixel, a bold dotted line shows a spectrum distribution of the light incident on the green pixel, and a bold dashed line shows a spectrum distribution of the light incident on the red pixel. For comparison, when a related color filter is used instead of the color separating lens array 130, the spectrum distributions of light incident on the blue pixel, green pixel, and red pixel, respectively, is indicated by thin lines in FIG. 19.

A thin solid line shows a spectrum distribution of the light incident on the blue pixel, a thin dotted line shows a spectrum distribution of the light incident on the green pixel, and a thin dashed line shows a spectrum distribution of the light incident on the red pixel. Referring to FIG. 19, the intensity of light expressed by the bold line is greater than that of the light expressed by the thin line. Therefore, the light utilization efficiency of the image sensor 1000 may be improved when the color separating lens array 130 is used compared to when a related color filter is used. The pattern of the color separating lens array 130 that satisfies the phase distribution and performance described above may be automatically designed through various computer simulations. For example, the patterns of the first to fourth regions 131, 132, 133, and 134 may be optimized through a nature-inspired algorithm such as a genetic algorithm, a particle swarm optimization algorithm, an ant colony optimization algorithm, etc., or a reverse design based on an adjoint optimization algorithm. For the design of the color separating lens array 130, the first to fourth patterns of the first to fourth regions 131, 132, 133, and 134 may be optimized by evaluating the performances of a plurality of candidate color separating lens arrays using evaluation factors such as color separating spectrum, luminance efficiency, and signal-to-noise ratio.

For example, the first to fourth patterns of the first to fourth regions 131, 132, 133, and 134 may be optimized in a manner that a target numerical value of each evaluation element is determined in advance, and then the sum of the differences between the actual values and the target numerical values of a plurality of evaluation elements is minimized. According to another example embodiment, the performance may be indexed for each evaluation element, and the first to fourth patterns of the first to fourth regions 131, 132, 133, and 134 may be optimized such that a value representing the performance may be maximized. The color separating lens array 130 shown in FIG. 4 is only one example, and various types of color separating lens array 130 may be obtained through the above-described optimized design according to the size and thickness of the first to fourth regions 131, 132, 133, and 134 of the color separating lens array 130, the color characteristics of the image sensor to which the color separating lens array 130 is applied, the pixel pitch, the distance between the color separating lens array 130 and the image sensor, and the incident angle of incident light.

Figure 20:
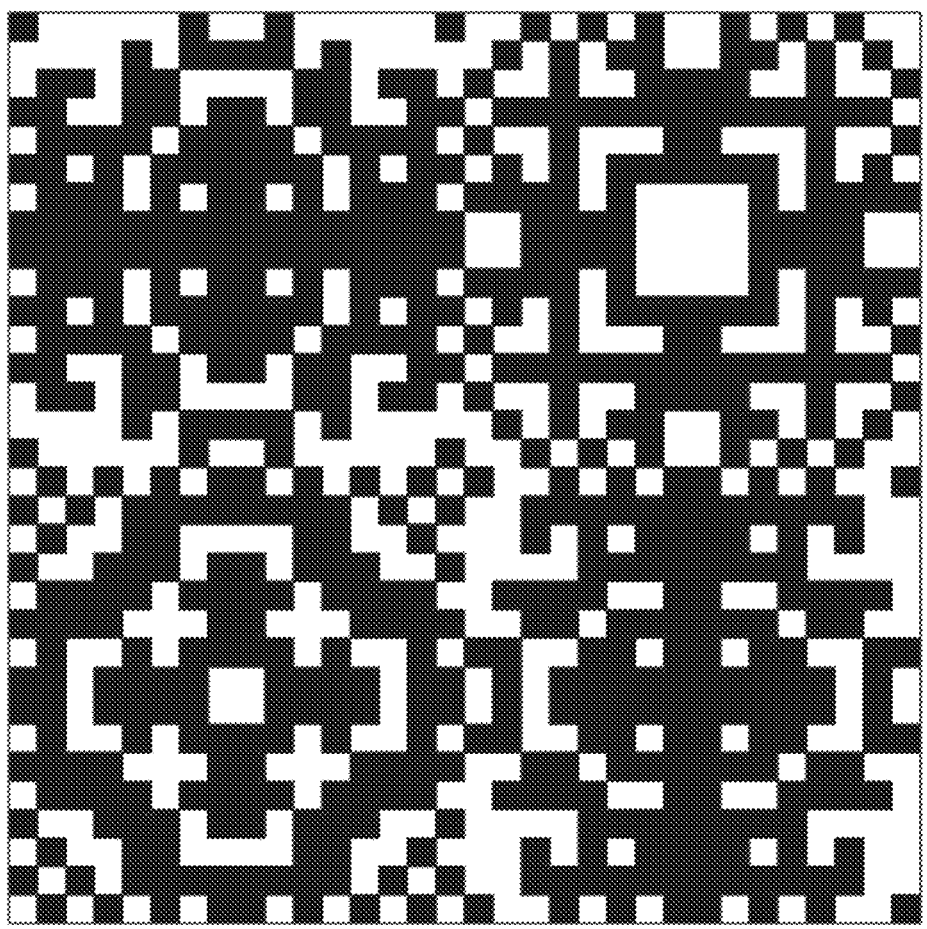
FIG. 20 is a plan view showing a shape of a unit pattern array of a color separating lens array according to another example embodiment.
Figure 21:
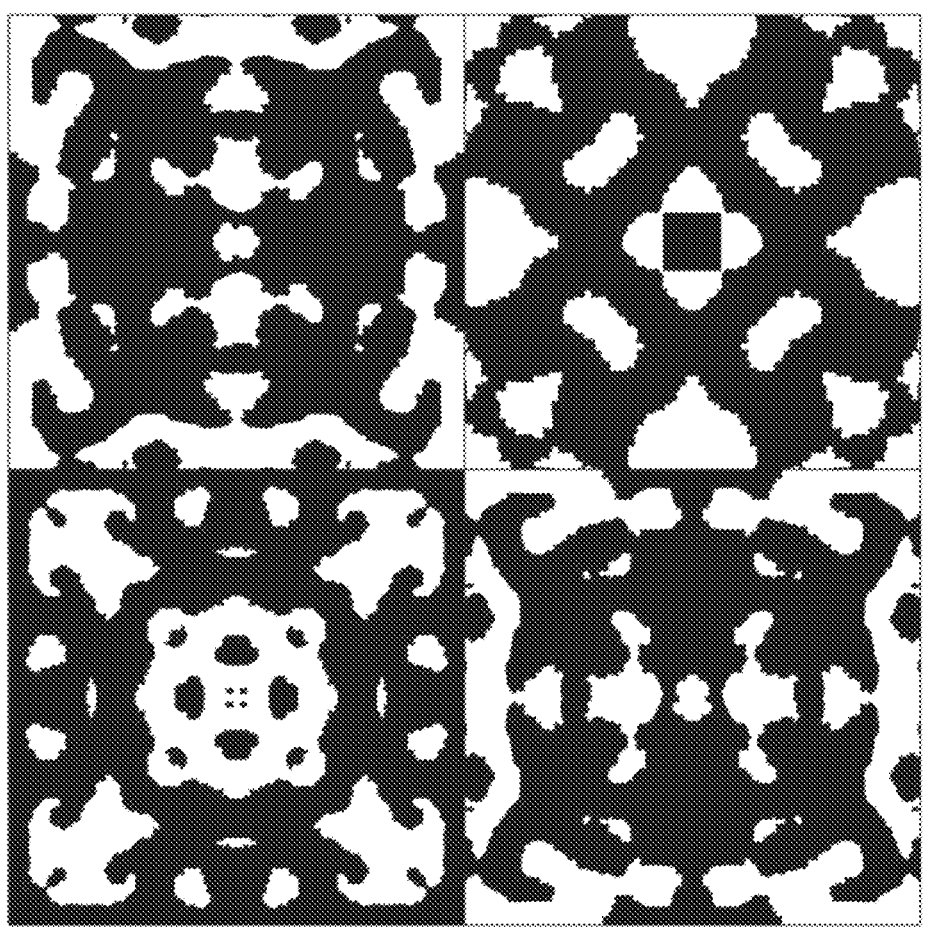
FIG. 21 is a plan view showing a shape of a unit pattern array of a color separating lens array according to another example embodiment.

For example, FIG. 20 is a plan view showing a shape of a unit pattern array of a color separating lens array according to another example embodiment that can be applied to the Bayer pattern type image sensor. FIG. 21 is a plan view showing a shape of a unit pattern array of a color separating lens array according to another example embodiment that can be applied to the Bayer pattern type image sensor. Each of the first to fourth regions 131, 132, 133, and 134 shown in FIG. 4 is optimized in a digitized binary form in a 14×14 rectangular arrangement, and each of the first to fourth regions 131, 132, 133, and 134 shown in FIG. 20 is optimized in a digitized binary form in a 16×16 rectangular arrangement. The amount of calculation with respect to the optimization may be reduced in a digitized binary form. Therefore, the unit pattern array of the color separating lens array 130 shown in FIG. 4 has a shape of a 28×28 rectangular arrangement, and the unit pattern array of the color separating lens shown in FIG. 20 has a shape of a 32×32 rectangular arrangement. In this case, the shape of the cross section of the first to fourth regions 131, 132, 133, and 134 shown in FIGS. 5 and 6 is discontinuously changed as line A-A' moves in the Y-direction or as line B-B' moves in the X-direction. According to another example embodiment, each of the first to fourth regions 131, 132, 133, and 134 shown in FIG. 21 may be optimized in the form of a continuous curve that is not digitized, with improved color separation performance. In this case, the shape of the cross section of the first to fourth regions 131, 132, 133, and 134 shown in FIGS. 5 and 6 is continuously changed as line A-A' moves in the Y-direction or as line B-B' moves in the X-direction.

Figure 22A:
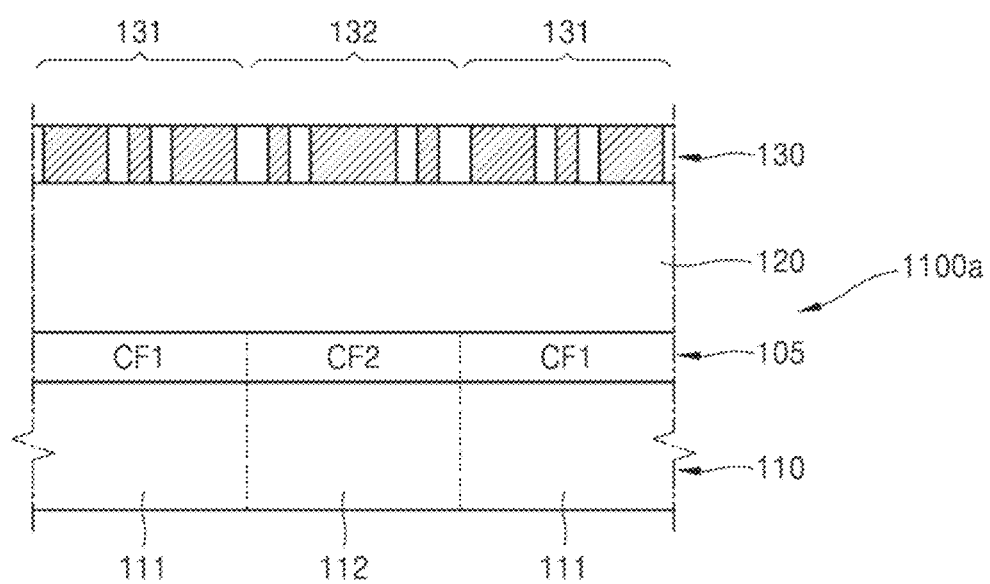
FIGS. 22A and 22B are cross-sectional views of a pixel array of an image sensor according to another example embodiment showing different cross-sections.
Figure 22B:
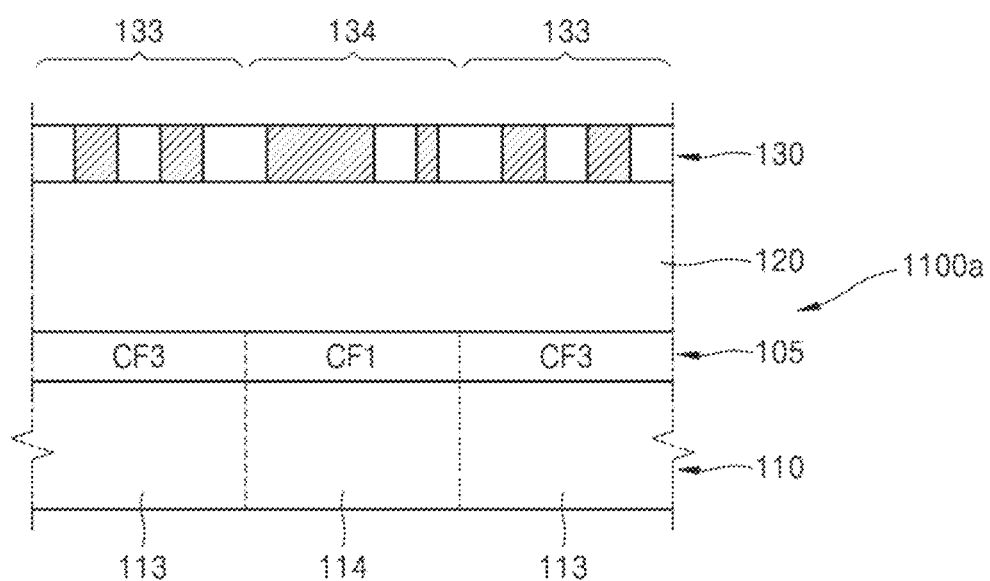

FIGS. 22A and 22B are cross-sectional views of a pixel array 1100a of an image sensor according to another example embodiment showing different cross-sections. Referring to FIGS. 22A and 22B, the pixel array 1100a includes the sensor substrate 110 including the plurality of photo-sensing cells 111, 112, 113, and 114 configured to convert the intensity of an incident light into an electrical signal, a color filter layer 105 disposed on the sensor substrate 110, a spacer layer 120 disposed on the color filter layer 105, and the color separating lens array 130 disposed on the spacer layer 120. The color filter layer 105 may include a first color filter CF1 disposed on the first photo-sensing cell 111 and the fourth photo-sensing cell 114, a second color filter CF2 disposed on the second photo-sensing cell 112, and a third color filter CF3 disposed on the third photo-sensing cell 113. For example, the first color filter CF1 may be a green color filter that transmits only green light and absorbs the other incident light, the second color filter CF2 may be a blue color filter that transmits only blue light and absorbs the other incident light, and the third color filter CF3 may be the red color filter that transmits only the red light and absorbs the other incident light. The image sensor 1000 may achieve higher color purity by using the color filters CF1, CF2, and CF3.

According to the example embodiment, since the light that has already been color-separated to a considerable extent by the color separating lens array 130 is incident on the color filters CF1, CF2, and CF3, the light loss due to the color filter layer 105 is may be relatively small. When color separation can be sufficiently performed by the color separating lens array 130, the color filter layer 105 may be omitted, or only some of the first to third color filters CF1, CF2, and CF3 may be omitted.

The above-described specific patterns of the color separating lens array 130 are merely exemplary, the patterns may be variously modified. For example, according to the different pattern types of the first to fourth regions 131, 132, 133, and 134 of the color separating lens array 130, light of wavelength bands other than visible light may be separated. Also, the number of color separation patterns configuring one unit pattern array in the color separating lens array 130 may vary depending on the application examples of the color separating lens array 130. The pixel arrangement of the image sensor has been described by exemplifying the Bayer pattern, but embodiments are not limited thereto, and may also be applied to the pixel arrangement, for example, shown in FIGS. 2B and 2C. A pattern suitable for this pixel arrangement may be determined by adopting regions of the color separating lens array 130 and using the above-described optimization method for each region.

Figure 23:
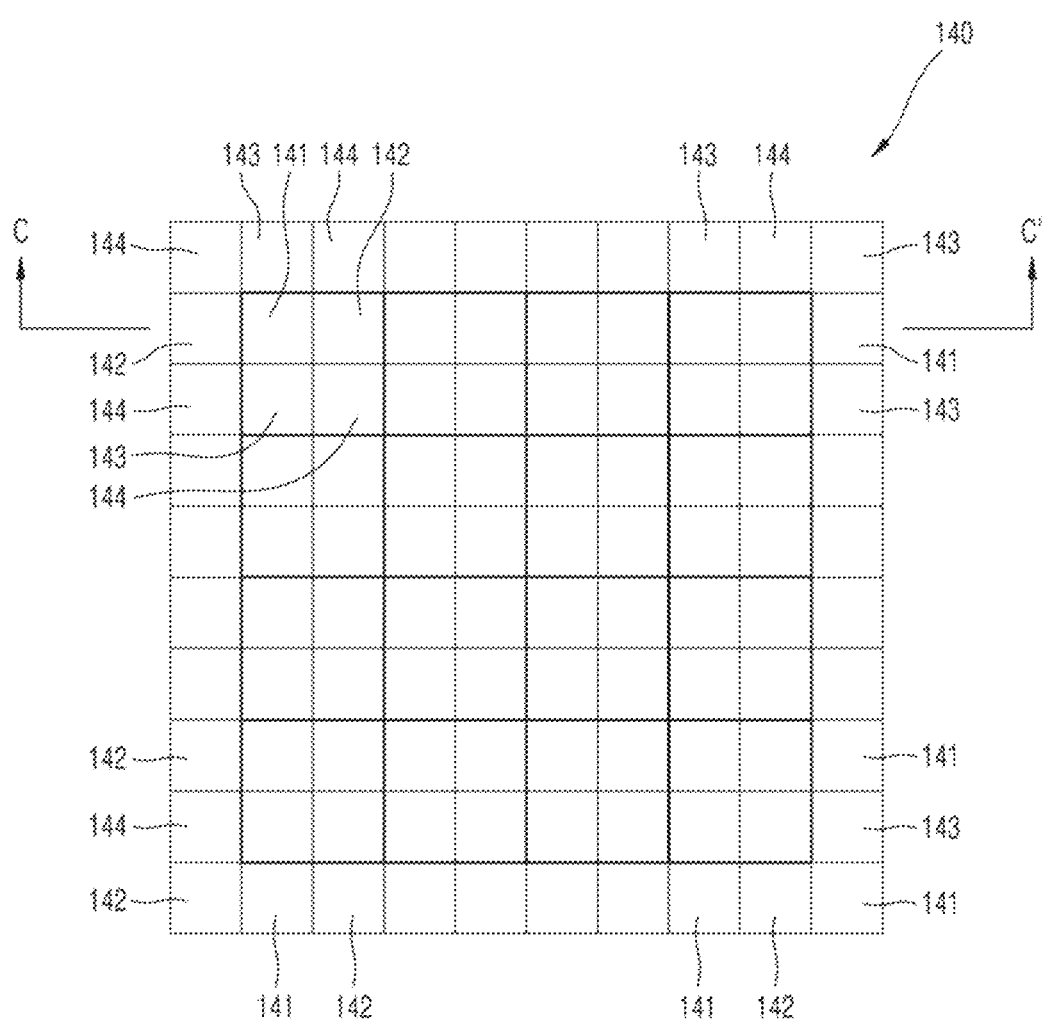
FIG. 23 is a plan view showing a color separating lens array according to another example embodiment.

FIG. 23 is a plan view showing a color separating lens array 140 according to another example embodiment. Referring to FIG. 23, the color separating lens array 140 may include a plurality of unit pattern arrays indicated by bold lines and disposed two-dimensionally. Each unit pattern array may be disposed in the form of 2×2 including a first region 141, a second region 142, a third region 143, and a fourth region 144. In the entire structure of the color separating lens array 140, the first region 141 and the second region 142 are alternately disposed in the transverse direction within one row, and the third region 143 and the fourth region 144 are alternately disposed in the transverse direction within another row. In addition, the first region 141 and the third region 143 are alternately disposed in the longitudinal direction within one column, and the second region 142 and the fourth region 144 are alternately disposed in the longitudinal direction within another column.

In addition, the color separating lens array 140 may further include a plurality of first to fourth regions 141, 142, 143, and 144 that are not included in any of the unit pattern arrays. The first to fourth regions 141, 142, 143, and 144 that are not included in any of the unit pattern arrays may be disposed along the edge of the color separating lens array 140. For example, a plurality of second regions 142 and a plurality of fourth regions 144 configuring one column are additionally disposed at the left edge of the color separating lens array 140, a plurality of first regions 141 and a plurality of third regions 143 configuring one column are additionally disposed at the right edge, a plurality of third regions 143 and a plurality of fourth regions 144 configuring one row are additionally disposed at the upper edge, and a plurality of first regions 141 and a plurality of second regions 142 configuring one row may be additionally disposed at the lower edge.

Figure 24:
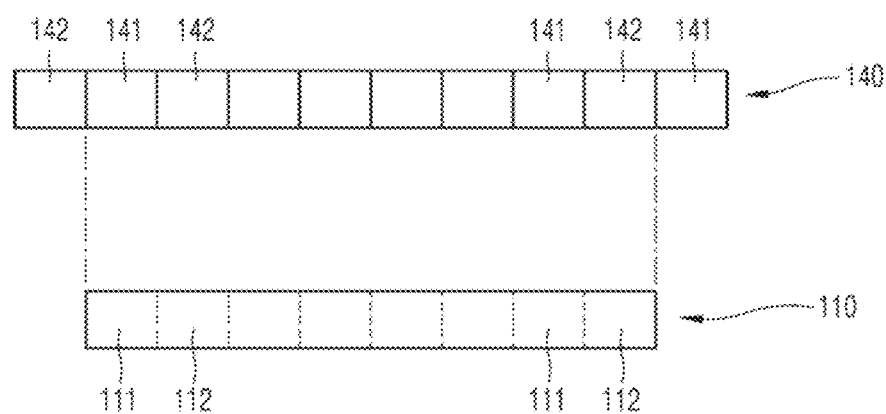
FIG. 24 is a cross-sectional view of a pixel array of an image sensor including the color separating lens array of FIG. 23.

FIG. 24 is a diagram showing a cross section of the color separating lens array 140 of FIG. 23 taken along line C-C'. Referring to FIG. 24, the color separating lens array 140 may include a plurality of first regions 141 and a plurality of second regions 142 that are disposed to protrude in a horizontal direction with respect to an edge of the sensor substrate 110 and do not face any photo-sensing cell of the sensor substrate 110 in the vertical direction. The plurality of first to fourth regions 141, 142, 143, and 144 that are not included in any unit pattern array in FIG. 23 are all disposed to protrude in the horizontal direction with respect to the corresponding edge of the sensor substrate 110 and do not face any photo-sensing cell in the vertical direction. As described with reference to FIGS. 13A to 13D, 14A to 14D, and 15A to 15D, the photo-sensing cell may receive light not only from a region of the color separating lens array 140 corresponding to the vertical direction, but also from a plurality of other regions around the region. Therefore, when the first to fourth regions 141, 142, 143, and 144 are not added along the edges of the color separating lens array 140, the amount of light incident on the photo-sensing cells disposed along the edges of the sensor substrate 110 may decrease, and color purity may also decrease.

When the first to fourth regions 141, 142, 143, and 144 are additionally disposed along the edges of the color separating lens array 140, light may be provided to photo-sensing cells disposed along the edges of the sensor substrate 110 in the same manner as photo-sensing cells disposed inside the sensor substrate 110. Since the image sensors according to the above-described example embodiments have a very small amount of light loss due to the color filter, a sufficient amount of light may be provided to the pixels even when the size of the pixel is reduced.

Figure 25:
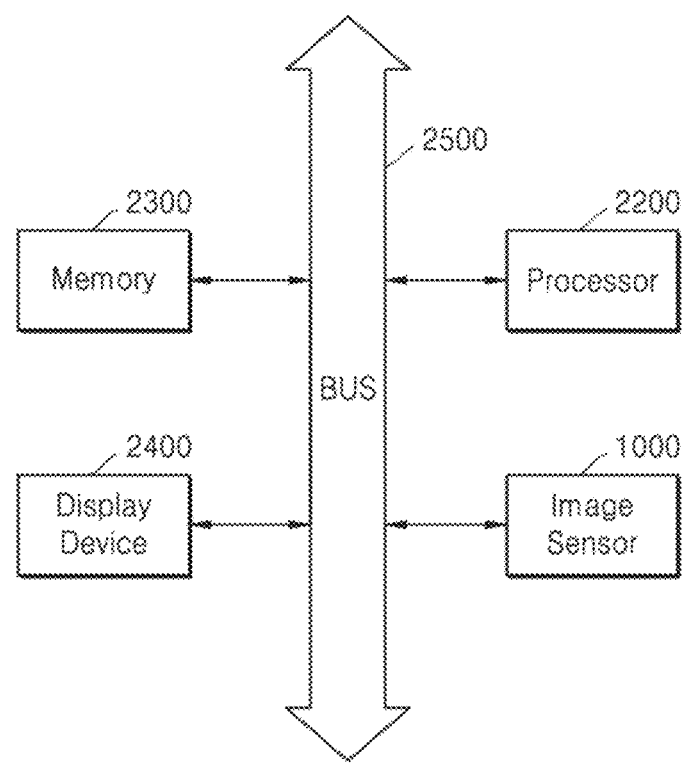
FIG. 25 is a block diagram showing an electronic apparatus including an image sensor according to example embodiments.

Therefore, it is possible to manufacture an ultra-high resolution, ultra-small, high-sensitivity image sensor having hundreds of millions of pixels or more. Such an ultra-high resolution, ultra-small, high-sensitivity image sensor may be employed in various high-performance optical apparatuses or high-performance electronic apparatuses. For example, these electronic apparatuses are, for example, smart phones, mobile phones, personal digital assistants (PDAs), laptop computers, personal computers (PCs), various portable devices, home appliances, security cameras, medical cameras, and automobiles, Internet of Things (IoT), mobile computing device, or non-mobile computing device, but are not limited thereto. FIG. 25 is a block diagram illustrating an electronic apparatus including an image sensor according to example embodiments.

The electronic apparatus includes an image sensor 1000, a processor 2200, a memory 2300, a display 2400, and a bus 2500. The image sensor 1000 obtains image information about an external object under the control of the processor 2200 and provides the image information to the processor 2200. The processor 2200 may store the image information provided from the image sensor 1000 in the memory 2300 through the bus 2500, and output the image information stored in the memory 2300 to the display device 2400 to be displayed to the user. Also, the processor 2200 may perform various image processing on image information provided from the image sensor 1000.

FIGS. 26 to 36 show various examples of an electronic apparatus to which an image sensor according to example embodiments is applied. The image sensor according to the example embodiments may be applied to various multimedia apparatuses having an image capturing function.

Figure 26:
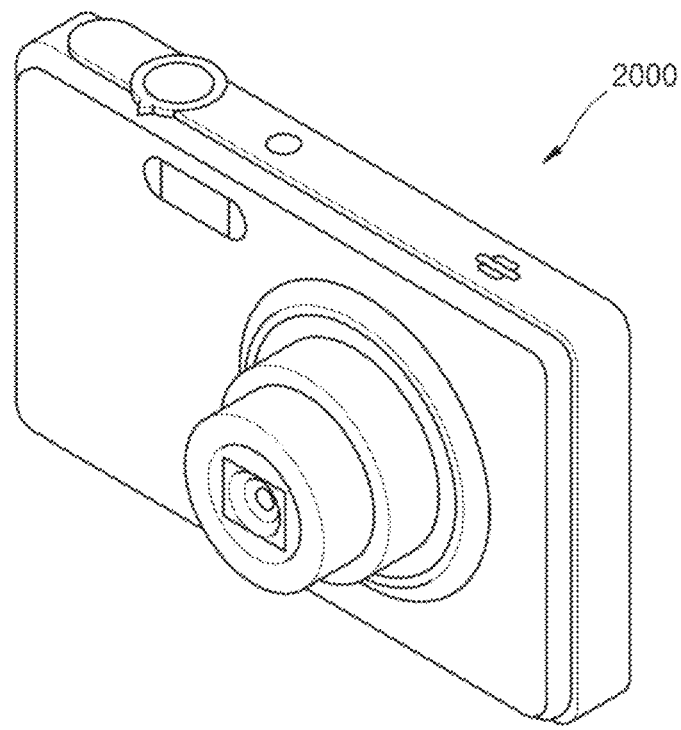
FIGS. 26, 27, 28, 29, 30, 31, 32, 33, 34, 35, and 36 show various examples of an electronic apparatus to which an image sensor according to example embodiments is applied.
Figure 27:
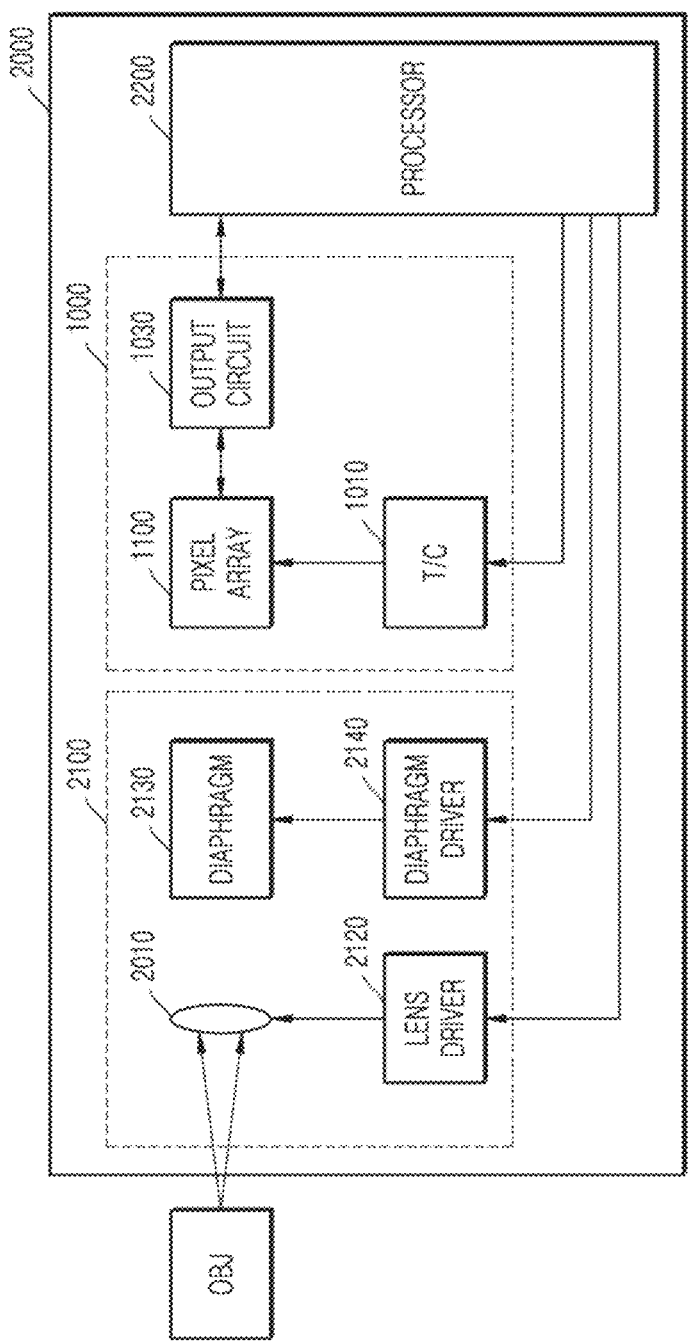
Figure 28:
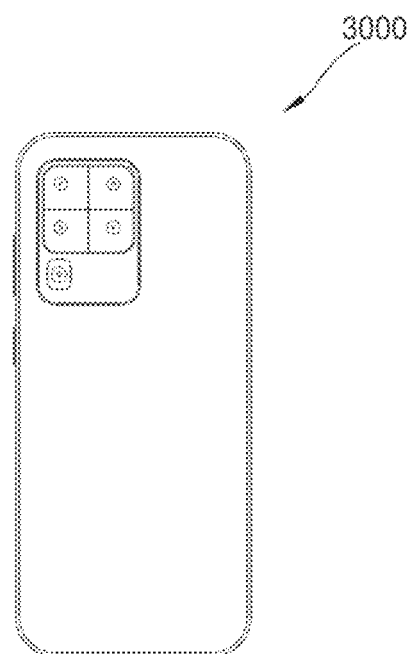
Figure 29:
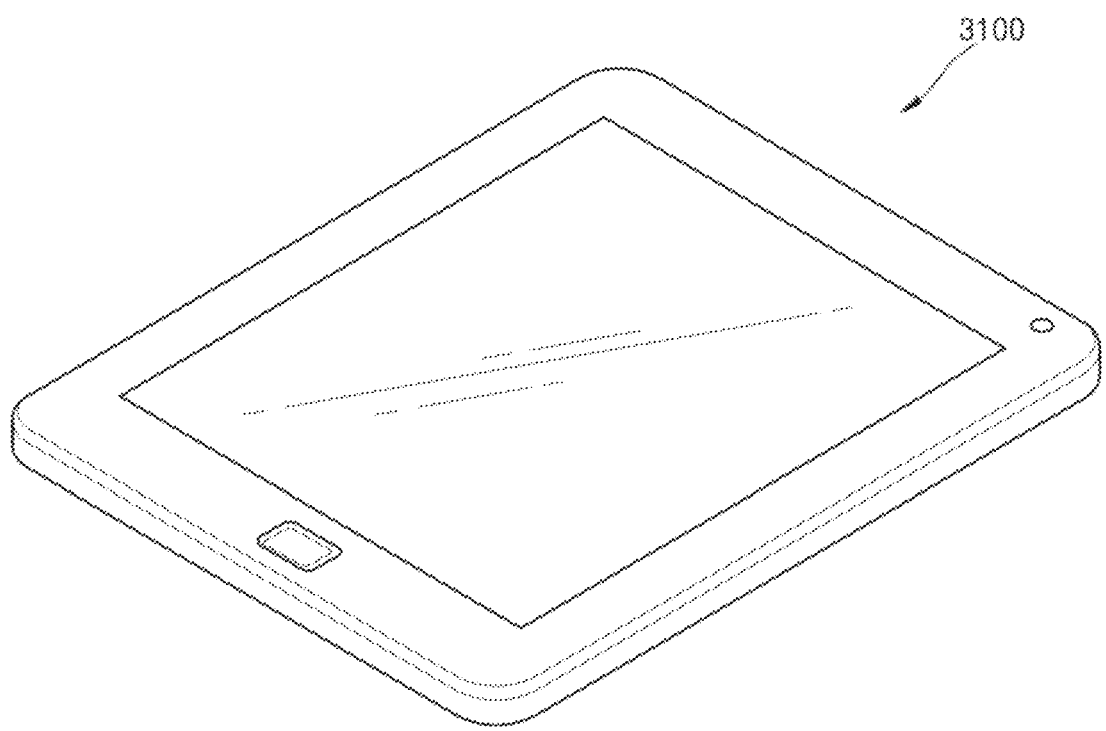
Figure 30:
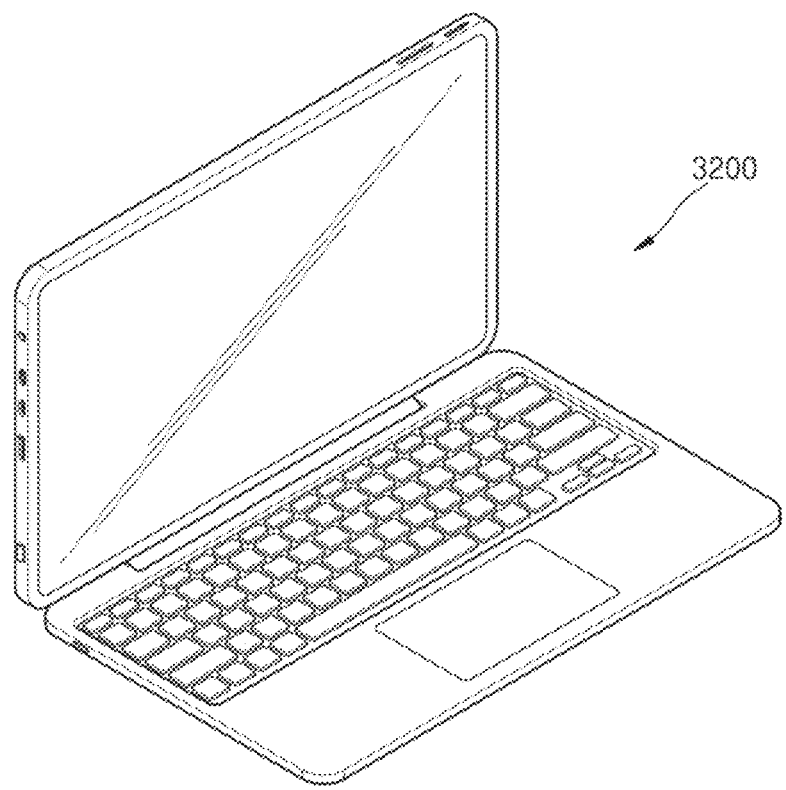
Figure 31:
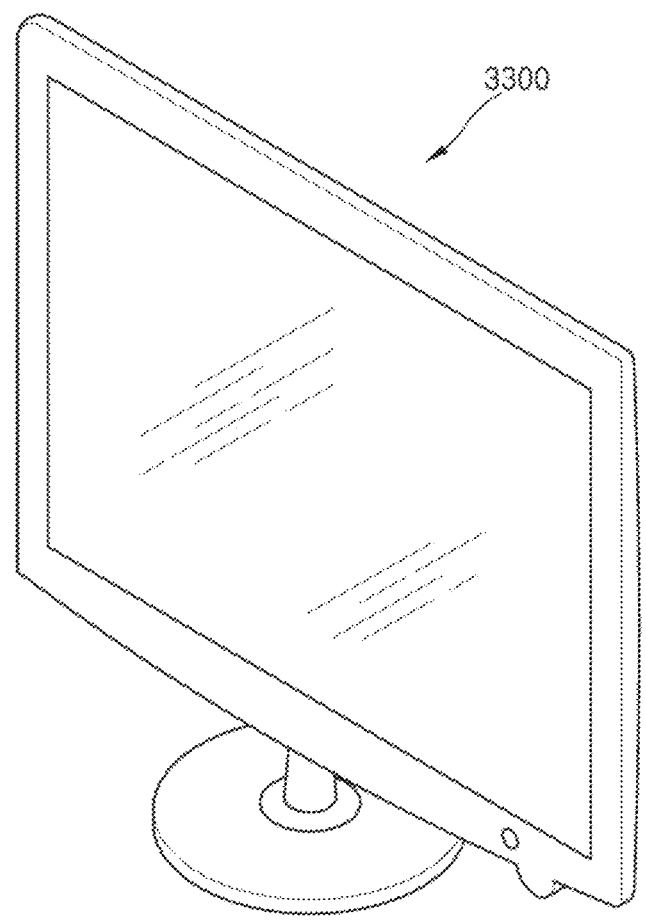

For example, the image sensor may be applied to a camera 2000 shown in FIG. 26. The camera 2000 may be a digital camera or a digital camcorder. Referring to FIG. 27, the camera 2000 may include an imaging assembly 2100, an image sensor 1000, and a processor 2200.

The imaging assembly 2100 forms an optical image by focusing light reflected from an object OBJ. The imaging assembly 2100 may include an objective lens 2010, a lens driver 2120, a diaphragm 2130, and a diaphragm driver 2140.

In FIG. 27, only one lens is representatively shown as an example, but the objective lens 2010 may include a plurality of lenses having different sizes and shapes. The lens driver 2120 may communicate information about focus detection with the processor 2200, and may adjust the position of the objective lens 2010 according to a control signal provided from the processor 2200. The lens driver 2120 may move the objective lens 2010 to adjust the distance between the objective lens 2010 and the object OBJ, or may adjust the positions of individual lenses in the objective lens 2010. As the objective lens 2010 is driven by the lens driver 2120, the focus on the object OBJ may be adjusted.

The camera 2000 may have an auto focus function. The diaphragm driver 2140 may communicate information about the amount of light with the processor 2200, and may adjust the diaphragm 2130 according to a control signal provided from the processor 2200. For example, the diaphragm driver 2140 may increase or decrease an aperture of the diaphragm 2130 according to the amount of light entering the camera 2000 through the objective lens 2010, and may adjust the opening time of the diaphragm 2130. The image sensor 1000 may generate an electrical image signal based on the intensity of incident light.

The image sensor 1000 may include a pixel array 1100, a timing controller 1010, and an output circuit 1030. The image sensor 1000 may further include a row decoder shown in FIG. 1. The light transmitted through the objective lens 2010 and diaphragm 2130 may form an image of the object OBJ on a light receiving surface of the pixel array 1100.

The pixel array 1100 may be a charge coupled device (CCD) or a complementary metal oxide semiconductor (CMOS) that converts an optical signal into an electrical signal. The pixel array 1100 may include additional pixels for performing an auto focus (AF) function or a distance measurement function. In addition, the pixel array 1100 may include the above-described color separating lens array.

The processor 2200 may control the overall operation of the camera 2000 and may have an image processing function.

For example, the processor 2200 may provide a control signal for operation of each component, such as the lens driver 2120, the diaphragm driver 2140, and the timing controller 1010. The image sensor according to example embodiments may be applied to a mobile phone or a smart phone 3000 shown in FIG. 28, a tablet or a smart tablet 3100 shown in FIG. 29, a notebook computer 3200 shown in FIG. 30, a television or a smart television 3300 shown in FIG. 31, and the like.

For example, the smart phone 3000 or the smart tablet 3100 may include a plurality of high resolution cameras each equipped with a high resolution image sensor.

High resolution cameras may be used to extract depth information of objects in an image, adjust the out-of-focusing of an image, or automatically identify objects in an image.

Figure 32:
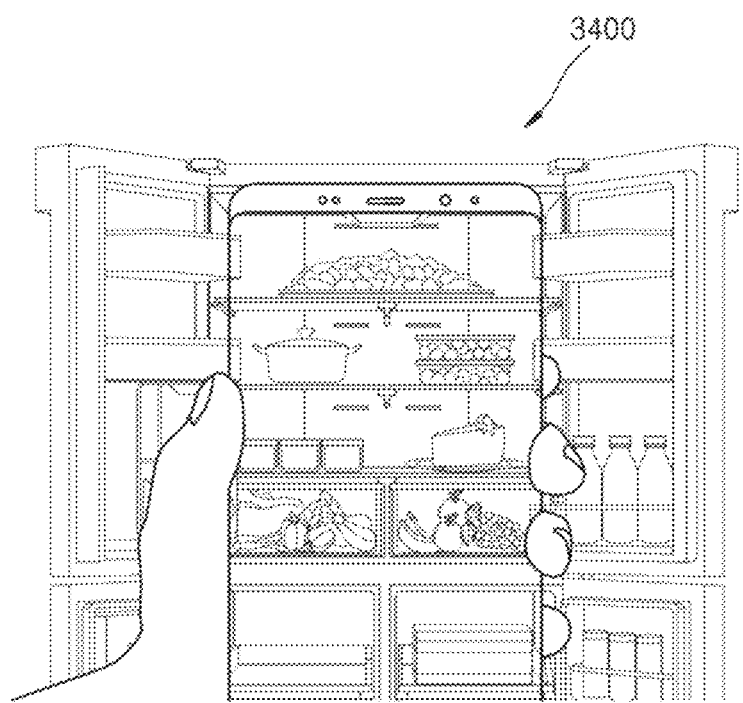
Figure 33:
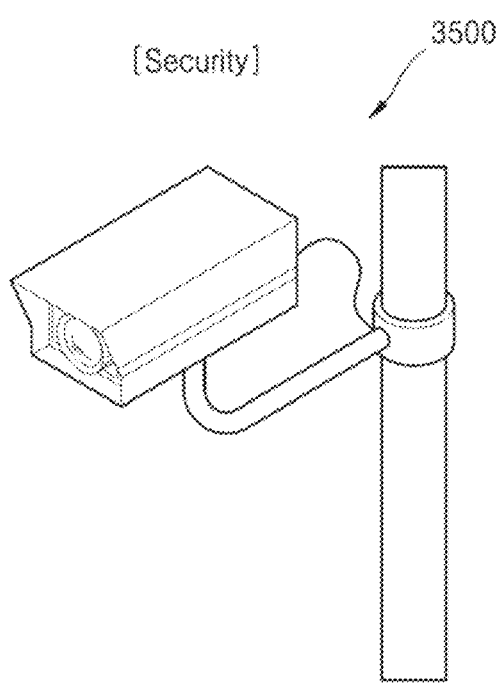
Figure 34:
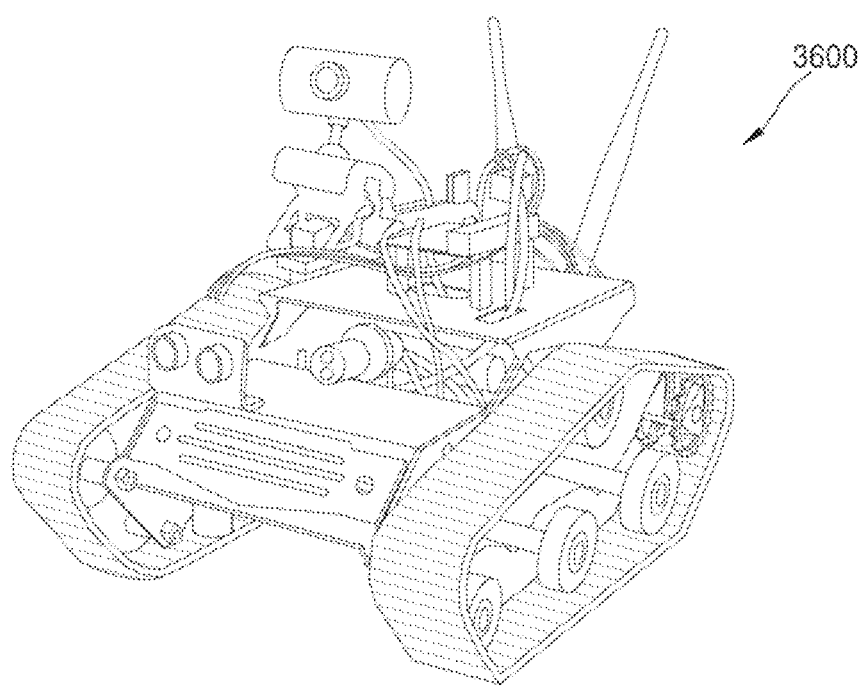
Figure 35:
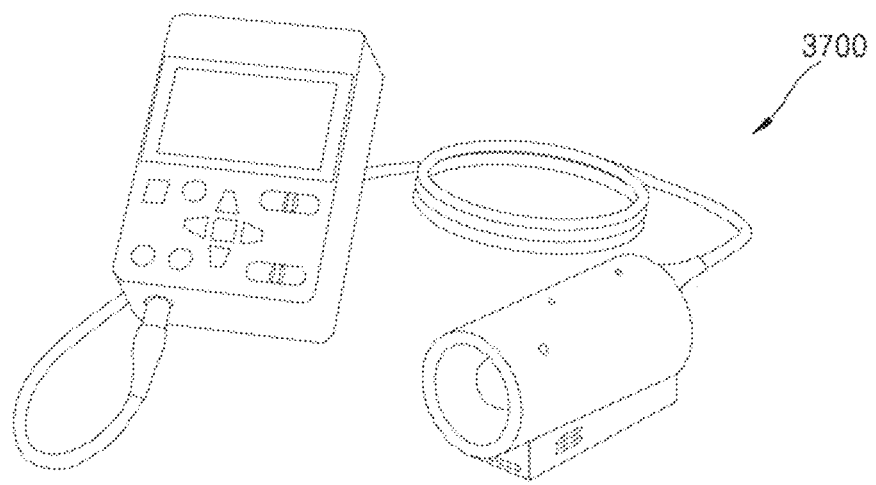

In addition, the image sensor can be applied to a smart refrigerator 3400 shown in FIG. 32, a security camera 3500 shown in FIG. 33, a robot 3600 shown in FIG. 34, a medical camera 3700 shown in FIG. 35, and the like.

For example, the smart refrigerator 3400 may automatically recognize food in a refrigerator using an image sensor and inform the user of the existence of a specific food, the type of food that has been put in or released, and the like through the smart phone.

The security camera 3500 may provide an ultra-high resolution image and may have a high sensitivity to allow objects or people in the image to be recognized even in a relatively dark environment.

The robot 3600 may enter a disaster or industrial site where humans cannot directly access to provide high resolution images.

Figure 36:
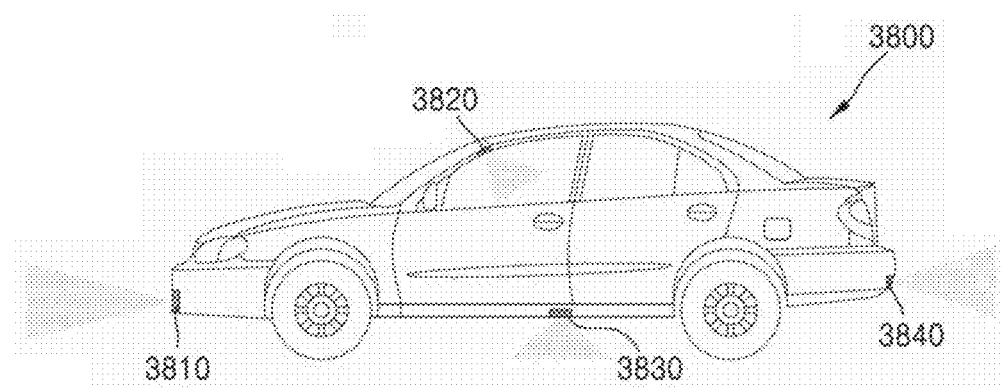

The medical camera 3700 may provide high resolution images for diagnosis or surgery and may dynamically adjust the field of view. Further, the image sensor may be applied to a vehicle 3800 as shown in FIG. 36.

The vehicle 3800 may include a plurality of vehicle cameras 3810, 3820, 3830, and 3840 disposed in various positions, and respective vehicle cameras 3810, 3820, 3830, and 3840 may include an image sensor according to an example embodiment.

The vehicle 3800 may provide a variety of information about the interior or surroundings of the vehicle 3800 to a driver using a plurality of vehicle cameras 3810, 3820, 3830, and 3840, and may automatically recognize objects or people in the image to provide information necessary for autonomous driving.

Since the disclosed color separating lens array may separate and condense incident light according to wavelengths of incident light without absorbing or blocking the incident light, it is possible to improve light utilization efficiency of the image sensor according to example embodiments.

In addition, the image sensor adopting the color separating lens array according to example embodiments may implement the Bayer pattern type that is generally adopted in the image sensor, and thus the pixel structure and the image processing algorithm of existing image sensors may be used.

In addition, an image sensor employing the disclosed color separating lens array according to example embodiments does not require a separate microlens for condensing light to a pixel.

Although the image sensor including the color separating lens array, and the electronic apparatus including the image sensor have been described with reference to exemplary embodiments thereof, it will be understood by those of ordinary skill in the art that various changes in form and details may be made therein without departing from the spirit and scope as defined by the following claims.

The example embodiments should be considered in descriptive sense only and not for purposes of limitation.

Therefore, the scope of the disclosure is defined not by the detailed description of the disclosure but by the appended claims, and all differences within the scope will be construed as being included in the present disclosure.

What is claimed is:

1. An image sensor comprising:
a sensor substrate comprising a first photo-sensing cell and a second photo-sensing cell respectively configured to sense light;
a spacer layer that is transparent and disposed on the sensor substrate; and
a color separating lens array disposed on the spacer layer opposite to the sensor substrate,
wherein the color separating lens array comprises:
a first region disposed opposite to the first photo-sensing cell in a vertical direction, the first region having a first pattern, and
a second region disposed opposite to the second photo-sensing cell in the vertical direction, the second region having a second pattern that is different from the first pattern,
wherein the first pattern and the second pattern are configured to separate light of a first wavelength and light of a second wavelength different from the first wavelength, from among incident light incident on the first region and the second region, condense the light of the first wavelength, separated from the incident light incident on the first region and the second region, to the first photo-sensing cell, and condense the light of the second wavelength, separated from the incident light incident on the first region and the second region, to the second photo-sensing cell,
wherein each of the first region and the second region has a digitized binary form in a two dimensional arrangement,
wherein the first region comprises a first dielectric having a first refractive index and forming the first pattern and a second dielectric having a second refractive index that is less than the first refractive index and filled between the first dielectric, and the first pattern is formed such that the first dielectric is included in any cross section, cut along a line in an X direction or a Y direction, of the first region, the X direction and the Y direction being perpendicular to the vertical direction, and
wherein the second region comprises the first dielectric having the first refractive index and forming the second pattern, and the second dielectric having the second refractive index that is less than the first refractive index and filled between the first dielectric, and the second pattern is formed such that the first dielectric is included in any cross section, cut along a line in the X direction or the Y direction, of the second region.

2. The image sensor of claim 1, wherein the spacer layer has a thickness corresponding to a focal length of the color separating lens array with respect to a center wavelength of a wavelength band of the incident light to be separated by the color separating lens array.

3. The image sensor of claim 1, wherein a theoretical thickness of the spacer layer is ht, a pitch between adjacent photo-sensing cells is p, a refractive index of the spacer layer is n, and a center wavelength of a wavelength band of the incident light to be separated by the color separating lens array is λ0, the theoretical thickness of the spacer layer satisfies:

$$h_t = \frac{np^2}{\lambda_0} - \frac{\lambda_0}{4n},$$

and
an actual thickness h of the spacer layer satisfies $h_t-p \leq h \leq h_t+p$.

4. The image sensor of claim 1, wherein the first pattern and the second pattern are configured such that the light of the first wavelength, at a position immediately after passing through the color separating lens array, forms a phase distribution of $2N\pi$ at a position corresponding to a center of the first photo-sensing cell and forms a phase distribution of $(2N-1)\pi$ at a position corresponding to a center of the second photo-sensing cell, where N is an integer greater than 0.

5. The image sensor of claim 4, wherein the first pattern and the second pattern are configured such that the light of the second wavelength, at the position immediately after passing through the color separating lens array, forms a phase distribution of $(2M-1)\pi$ at a position corresponding to the center of the first photo-sensing cell and forms a phase distribution of $2M\pi$ at a position corresponding to the center of the second photo-sensing cell, where M is an integer greater than 0.

6. The image sensor of claim 1, wherein the sensor substrate further comprises a third photo-sensing cell and a fourth photo-sensing cell, and
wherein the color separating lens array further comprises:
a third region disposed opposite to the third photo-sensing cell in the vertical direction, the third region having a third pattern that is different from the first pattern and the second pattern, and
a fourth region disposed opposite to the fourth photo-sensing cell in the vertical direction, the fourth region having a fourth pattern different from the first pattern, the second pattern, and the third pattern.

7. The image sensor of claim 6, wherein the third region is disposed adjacent to the first region and at a diagonal direction of the second region, and the fourth region is disposed adjacent to the second region and at a diagonal direction of the first region, and
wherein the third pattern is configured to separate, from the incident light, light of a third wavelength that is different from the first wavelength and the second wavelength, and condense the light of the third wavelength to the third photo-sensing cell, and the fourth pattern is configured to separate, from the incident light, the light of the first wavelength and condense the light of the first wavelength to the fourth photo-sensing cell.

8. The image sensor of claim 7, wherein the first pattern, the second pattern, the third pattern, and the fourth pattern are configured such that the light of the first wavelength, at a position immediately after passing through the color separating lens array, forms a phase distribution of $2N\pi$ at positions corresponding to centers of the first photo-sensing cell and the fourth photo-sensing cell, and forms a phase distribution of $(2N-1)\pi$ at positions corresponding to centers of the second photo-sensing cell and the third photo-sensing cell, where N is an integer greater than 0.

9. The image sensor of claim 8, wherein the first pattern, the second pattern, the third pattern, and the fourth pattern are configured such that the light of the second wavelength, at a position immediately after passing through the color separating lens array, forms a phase distribution of $(2M-1)\pi$ at positions corresponding to the centers of the first photo-sensing cell and the fourth photo-sensing cell, forms a phase distribution of $2M\pi$ at a position corresponding to the center of the second photo-sensing cell, and forms a phase distribution that is greater than $(2M-2)\pi$ and less than $(2M-1)\pi$ at a position corresponding to the center of the third photo-sensing cell, where M is an integer greater than 0.

10. The image sensor of claim 9, wherein the first pattern, the second pattern, the third pattern, and the fourth pattern are configured such that the light of the third wavelength, at the position immediately after passing through the color separating lens array, forms a phase distribution of $(2L-1)\pi$ at positions corresponding to the centers of the first photo-sensing cell and the fourth photo-sensing cell, forms a phase distribution that is greater than $(2L-2)\pi$ and less than $(2L-1)\pi$ at a position corresponding to the center of the second photo-sensing cell, and forms a phase distribution of $2L\pi$ at a position corresponding to the center of the third photo-sensing cell, where L is an integer greater than 0.

11. The image sensor of claim 7, wherein the first pattern, the second pattern, the third pattern, and the fourth pattern are configured such that, among the incident light incident on the first region of the color separating lens array, the light of the first wavelength travels toward the center of the first photo-sensing cell corresponding to the first region, the light of the second wavelength travels toward the center of the second photo-sensing cell adjacent to the first photo-sensing cell corresponding to the first region, and the light of the third wavelength travels toward the center of the third photo-sensing cell adjacent to the first photo-sensing cell corresponding to the first region.

12. The image sensor of claim 7, wherein the first pattern, the second pattern, the third pattern, and the fourth pattern are configured such that, among the incident light incident on the second region of the color separating lens array, the light of the second wavelength travels toward the center of the second photo-sensing cell corresponding to the second region, the light of the first wavelength travels toward the centers of the first photo-sensing cell and the fourth photo-sensing cell adjacent to the second photo-sensing cell corresponding to the second region, and the light of the third wavelength travels toward the center of the third photo-sensing cell adjacent to the second photo-sensing cell corresponding to the second region.

13. The image sensor of claim 7, wherein the first pattern, the second pattern, the third pattern, and the fourth pattern are configured such that, among the incident light incident on the third region of the color separating lens array, the light of the third wavelength travels toward the center of the third photo-sensing cell corresponding to the third region, the light of the first wavelength travels toward the centers of the first photo-sensing cell and the fourth photo-sensing cell adjacent to the third photo-sensing cell corresponding to the third region, and the light of the second wavelength travels toward the center of the second photo-sensing cell adjacent to the third photo-sensing cell corresponding to the third region.

14. The image sensor of claim 7, wherein the first pattern, the second pattern, the third pattern, and the fourth pattern are configured such that, among the incident light incident on the fourth region of the color separating lens array, the light of the first wavelength travels toward the center of the fourth photo-sensing cell corresponding to the fourth region, the light of the second wavelength travels toward the center of the second photo-sensing cell adjacent to the fourth photo-sensing cell corresponding to the fourth region, and the light of the third wavelength travels toward the center of the third photo-sensing cell adjacent to the fourth photo-sensing cell corresponding to the fourth region.

15. The image sensor of claim 7, wherein the light of the first wavelength is green light, the light of the second wavelength is blue light, and the light of the third wavelength is red light.

16. The image sensor of claim 15, wherein the first pattern and the fourth pattern have two-fold symmetry, the second pattern and the third pattern have four-fold symmetry, and the fourth pattern has a same shape as the first pattern that is rotated by 90 degrees.

17. The image sensor of claim 7, wherein the color separating lens array further comprises a plurality of unit pattern arrays each including the first region, the second region, the third region, and the fourth region adjacent to each other, and
wherein the plurality of unit pattern arrays are repeatedly disposed two-dimensionally.

18. The image sensor of claim 7, wherein the color separating lens array further comprises a plurality of first regions, a plurality of second regions, a plurality of third regions, and a plurality of fourth regions that are disposed to protrude with respect to edges of the sensor substrate and do not face any photo-sensing cell of the sensor substrate in the vertical direction.

19. The image sensor of claim 1, further comprising a color filter layer disposed between the sensor substrate and the spacer layer, the color filter layer comprising a plurality of color filters.

20. An image sensor comprising:
a sensor substrate comprising a first photo-sensing cell, a second photo-sensing cell, a third photo-sensing cell, and a fourth photo-sensing cell respectively configured to sense light;
a spacer layer that is transparent and disposed on the sensor substrate; and
a color separating lens array disposed on the spacer layer opposite to the sensor substrate, the color separating lens array comprising:
a first region disposed opposite to the first photo-sensing cell in a vertical direction, the first region having a first pattern,
a second region disposed opposite to the second photo-sensing cell in the vertical direction, the second region having a second pattern that is different from the first pattern,
a third region disposed opposite to the third photo-sensing cell in the vertical direction, the third region having a third pattern that is different from the first pattern and the second pattern, and
a fourth region disposed opposite to the fourth photo-sensing cell in the vertical direction, the fourth region having a fourth pattern that is different from the first pattern, the second pattern, and the third pattern,
wherein the third region is disposed adjacent to the first region and at a diagonal direction of the second region, and the fourth region is disposed adjacent to the second region and at a diagonal direction of the first region, wherein the first pattern and the fourth pattern have two-fold symmetry, the second pattern and the third pattern have four-fold symmetry, and wherein the fourth pattern has a same shape as the first pattern that is rotated by 90 degrees.

21. The image sensor of claim 20, wherein the first pattern is configured to separate, from incident light incident on the color separating lens array, light of a first wavelength and condense the light of the first wavelength to the first photo-sensing cell, wherein the second pattern is configured to separate, from the incident light, light of a second wavelength and condense the light of the second wavelength to the second photo-sensing cell, wherein the third pattern is configured to separate, from the incident light, light of a third wavelength and condense the light of the third wavelength to the third photo-sensing cell, and wherein the fourth pattern is configured to separate, from the incident light, light of the first wavelength and condense the light of the first wavelength to the fourth photo-sensing cell.

22. An imaging apparatus comprising:

an objective lens configured to focus light reflected from an object and form an optical image; and an image sensor configured to convert the optical image formed by the objective lens into an electric image signal, wherein the image sensor comprises:
- a sensor substrate comprising a first photo-sensing cell and a second photo-sensing cell respectively configured to sense light;
- a spacer layer that is transparent and disposed on the sensor substrate; and
- a color separating lens array disposed on the spacer layer opposite to the sensor substrate, wherein the color separating lens array comprises:
- a first region disposed opposite to the first photo-sensing cell in a vertical direction, the first region having a first pattern, and
- a second region disposed opposite to the second photo-sensing cell in the vertical direction, the second region having a second pattern that is different from the first pattern, wherein the first pattern and the second pattern are configured to separate light of a first wavelength and light of a second wavelength different from the first wavelength, from among incident light incident on the first region and the second region, condense the light of the first wavelength, separated from the incident light incident on the first region and the second region, to the first photo-sensing cell, and condense the light of the second wavelength, separated from the incident light incident on the first region and the second region, to the second photo-sensing cell, wherein each of the first region and the second region has a digitized binary form in a two dimensional arrangement, wherein the first region comprises a first dielectric having a first refractive index and forming the first pattern and a second dielectric having a second refractive index that is less than the first refractive index and filled between the first dielectric, and the first pattern is formed such that the first dielectric is included in any cross section, cut along a line in an X direction or a Y direction, of the first region, the X direction and the Y direction being perpendicular to the vertical direction, and wherein the second region comprises the first dielectric having the first refractive index and forming the second pattern, and the second dielectric having the second refractive index that is less than the first refractive index and filled between the first dielectric, and the second pattern is formed such that the first dielectric is included in any cross section, cut along a line in the X direction or the Y direction, of the second region.

23. An electronic apparatus comprising the imaging apparatus of claim 22.

24. An image sensor comprising:

a sensor substrate comprising a first photo-sensing cell, a second photo-sensing cell, a third photo-sensing cell, and a fourth photo-sensing cell respectively configured to sense light;

a spacer layer that is transparent and disposed on the sensor substrate; and a color separating lens array disposed on the spacer layer opposite to the sensor substrate, wherein the color separating lens array comprises:
- a first region disposed opposite to the first photo-sensing cell in a vertical direction,
- a second region disposed opposite to the second photo-sensing cell in the vertical direction,
- a third region disposed opposite to the third photo-sensing cell in the vertical direction, and
- a fourth region disposed opposite to the fourth photo-sensing cell in the vertical direction, wherein the first region, the second region, the third region, and the fourth region are configured to separate light a first wavelength, light of a second wavelength different from the first wavelength, and light of a third wavelength different from the first wavelength and the second wavelength, from among incident light incident on the first region, the second region, the third region, and the fourth region; condense the light of the first wavelength, separated from the incident light incident on the first region, the second region, the third region, and the fourth region, to the first photo-sensing cell and the fourth photo-sensing cell; condense the light of the second wavelength, separated from the incident light incident on the first region, the second region, the third region, and the fourth region, to the second photo-sensing cell; and condense the light of the third wavelength, separated from the incident light incident on the first region, the second region, the third region, and the fourth region, to the third photo-sensing cell, wherein each of the first region, the second region, the third region, and the fourth region is in a form of a continuous curve and shapes of cross sections of the first region, the second region, the third region, and the fourth region, which are cut along a line in an X direction or a Y direction, are continuously changed as the line in the X direction or the Y direction through which the cross sections are cut along moves in the Y direction or the X direction, the X direction and the Y direction being perpendicular to the vertical direction, and wherein each of the first region, the second region, the third region, and the fourth region comprises a first dielectric having a first refractive index and forming the continuous curve and a second dielectric having a second refractive index that is less than the first refractive index and filled between the first dielectric, and the first region has a first pattern, which is formed such that the first dielectric is included in any cross section, cut along a line in the X direction or the Y direction, of the first region.

25. The image sensor of claim 24, wherein the second region has a second pattern that is different from the first pattern, the third region has a third pattern that is different from the first pattern and the second pattern, and the fourth region has a same pattern as the first pattern that is rotated 90 degrees.

* * * * *